(12) United States Patent
Lee et al.

(10) Patent No.: US 8,142,251 B2
(45) Date of Patent: Mar. 27, 2012

(54) LASER BEAM IRRADIATION APPARATUS FOR SUBSTRATE SEALING, SUBSTRATE SEALING METHOD, AND METHOD OF MANUFACTURING ORGANIC LIGHT EMITTING DISPLAY DEVICE USING THE SAME

(75) Inventors: Jung-Min Lee, Yongin (KR);
Jang-Hwan Shin, Yongin (KR);
Tae-Wook Kang, Yongin (KR);
Jin-Hwan Jeon, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 12/983,974

(22) Filed: Jan. 4, 2011

(65) Prior Publication Data
US 2011/0165816 A1 Jul. 7, 2011

(30) Foreign Application Priority Data
Jan. 7, 2010 (KR) .................. 10-2010-0001310

(51) Int. Cl.
*H01J 9/26* (2006.01)
*B23K 26/00* (2006.01)
(52) U.S. Cl. .................. 445/25; 219/121.6; 219/121.85
(58) Field of Classification Search .............. 445/23–25; 219/121.6, 121.85; 250/491.1; 359/624
See application file for complete search history.

(56) References Cited

U.S. PATENT DOCUMENTS

| | | | |
|---|---|---|---|
| 5,622,567 A | 4/1997 | Kojima et al. | |
| 6,033,741 A | 3/2000 | Haruta et al. | |
| 6,110,291 A | 8/2000 | Haruta et al. | |
| 6,393,042 B1 | 5/2002 | Tanaka | |
| 6,506,635 B1 | 1/2003 | Yamazaki et al. | |
| 6,724,150 B2 | 4/2004 | Maruyama et al. | |
| 6,818,568 B2 | 11/2004 | Tanaka | |
| 6,844,523 B2 | 1/2005 | Yamazaki et al. | |
| 6,930,326 B2 | 8/2005 | Kato et al. | |
| 7,052,943 B2 | 5/2006 | Yamazaki et al. | |
| 2002/0164843 A1 | 11/2002 | Yamazaki et al. | |
| 2003/0080100 A1 | 5/2003 | Yamazaki et al. | |
| 2003/0089690 A1 | 5/2003 | Yamazaki et al. | |
| 2005/0139786 A1 | 6/2005 | Tanaka et al. | |
| 2005/0219454 A1 | 10/2005 | Lee | |
| 2006/0023058 A1 | 2/2006 | Tanaka | |
| 2006/0082298 A1 | 4/2006 | Becken et al. | |
| 2006/0119949 A1 | 6/2006 | Tanaka et al. | |
| 2007/0015323 A1 | 1/2007 | Isobe et al. | |
| 2007/0128965 A1 | 6/2007 | Burt et al. | |
| 2007/0128967 A1 | 6/2007 | Becken et al. | |

(Continued)

FOREIGN PATENT DOCUMENTS

KR 10-2007-0085333 A 8/2007

(Continued)

*Primary Examiner* — Joseph L Williams

(74) *Attorney, Agent, or Firm* — Robert E. Bushnell, Esq.

(57) ABSTRACT

A laser beam irradiation apparatus irradiates a laser beam onto a sealing unit disposed between a first substrate and a second substrate so as to seal the first substrate and the second substrate. The laser beam has a beam intensity which increases from a center portion to an end portion of the laser beam on a surface which is perpendicular to a proceeding direction of the laser beam. The beam intensity at the center portion of the laser beam is half of the beam intensity at the end portion of the laser beam or less, and the laser beam has a beam profile which is symmetrical relative to the proceeding direction of the laser beam.

47 Claims, 26 Drawing Sheets

U.S. PATENT DOCUMENTS

| | | |
|---|---|---|
| 2007/0246664 A1 | 10/2007 | Yamazaki et al. |
| 2008/0214021 A1 | 9/2008 | Tanaka et al. |
| 2009/0029525 A1 | 1/2009 | Ohnuma |
| 2009/0086325 A1 | 4/2009 | Liu et al. |
| 2009/0140249 A1 | 6/2009 | Yamada et al. |

FOREIGN PATENT DOCUMENTS

| | | |
|---|---|---|
| KR | 10-2007-0088671 A | 8/2007 |
| KR | 10-2007-0088682 A | 8/2007 |

LASER BEAM IRRADIATION APPARATUS FOR SUBSTRATE SEALING, SUBSTRATE SEALING METHOD, AND METHOD OF MANUFACTURING ORGANIC LIGHT EMITTING DISPLAY DEVICE USING THE SAME

CLAIM OF PRIORITY

This application makes reference to, incorporates the same herein, and claims all benefits accruing under 35 U.S.C. §119 from an application earlier filed in the Korean Intellectual Property Office on Jan. 7, 2010 and there duly assigned Serial No. 10-2010-0001310.

BACKGROUND OF THE INVENTION

1. Field of the Invention

The present invention relates to a laser beam irradiation apparatus, a method of sealing a substrate, and a method of manufacturing an organic light emitting display device.

2. Description of the Related Art

Recently, display devices are being replaced with portable, thin flat panel display devices. Among the flat panel display devices, electroluminescent display devices are self-emissive display devices which have a wide viewing angle and an excellent contrast ratio, and a high response speed, and thus are regarded as next-generation display devices. Also, an organic light emitting display device including an emission layer formed of an organic material has excellent luminosity, driving voltage, and response speed characteristics compared to inorganic light emitting display devices, and may realize multiple colors.

Organic light emitting display devices have a structure in which at least one organic layer including an emission layer is interposed between two electrodes.

When water or oxygen from the outside penetrates through the organic light emitting display device, an electrode material may be oxidized or exfoliation may occur, and this may reduce the lifespan and light emitting efficiency of the organic light emitting device, and light emitting colors may be deteriorated.

Accordingly, when manufacturing an organic light emitting display device, an organic light emitting device is usually sealed so as to isolate the organic light emitting device from the outside and so that water does not penetrate therein. Examples of the sealing process include a method in which an inorganic thin film and an organic polymer such as polyester (PET) are laminated on a second electrode of an organic light emitting display device, and a method in which an absorbent is formed in an encapsulation substrate and nitrogen gas is filled in the encapsulation substrate, and then a boundary of the encapsulation substrate is sealed using a sealant such as epoxy.

However, it is impossible to completely block such elements as water or oxygen penetrating from the outside, which destroy the organic light emitting device which is sealed using the above methods, and thus the methods cannot be applied to organic light emitting display devices which are particularly vulnerable to water, and a process for realizing the methods is also complicated. In order to solve these problems, a method in which frit is used as a sealant to improve adhesive properties between a substrate of the organic light emitting device and an encapsulation substrate has been designed.

By sealing an organic light emitting display device by coating frit on a glass substrate, the substrate of the organic light emitting device and the encapsulation substrate are completely sealed, thereby effectively protecting the organic light emitting display device.

A substrate is sealed using frit by coating the frit on a sealing unit of each of the organic light emitting display devices, and irradiating a laser beam onto a sealing unit of each of the organic light emitting display devices by moving a laser beam irradiation apparatus to irradiate the laser beam onto the sealing unit, thereby hardening the frit and sealing the substrate.

SUMMARY OF THE INVENTION

The present invention provides a laser beam irradiation apparatus including a beam profile for improving temperature uniformity of a frit cross-section, a method of sealing a substrate, and a method of manufacturing an organic light emitting display device.

According to an aspect of the present invention, a laser beam irradiation apparatus irradiates a laser beam onto a sealing unit disposed between a first substrate and a second substrate so as to seal the first substrate and the second substrate, wherein the laser beam has a beam intensity which increases from a center portion to an end portion of the laser beam on a surface which is perpendicular to a proceeding direction of the laser beam, and the beam intensity at the center portion of the laser beam is half of the beam intensity at the end portion of the laser beam or less, and the laser beam has a beam profile which is symmetrical relative to the proceeding direction of the laser beam.

The laser beam sequentially may include a first section in which a beam intensity slowly increases from a center portion to an end portion of the laser beam and a second section having a greater beam intensity increase rate than the first section.

The laser beam may be symmetrical relative to a surface which is parallel to a proceeding direction of the laser beam.

An inflection point on a boundary between the first section and the second section may be symmetrically distributed with respect to the center portion of the laser beam.

The laser beam may further include a third section in which a beam intensity rapidly decreases, and which is disposed on an outer portion of the second section.

The laser beam may further comprise a third section in which a beam intensity is uniform, and which is disposed on an outer portion of the second section.

The laser beam may be irradiated in the form of a spot beam.

The laser beam may have a uniform beam intensity on a surface which is parallel to the proceeding direction of the laser beam.

An inflection point, which is at a boundary between the first section and the second section, may be symmetrical on the surface which is perpendicular to the proceeding direction of the laser beam.

An inflection point, which is at a boundary between the first section and the second section, may not exist on the surface which is parallel to the proceeding direction of the laser beam.

A cross-section of the laser beam may be rectangular.

The laser beam on a surface which is parallel to the proceeding direction of the laser beam may have a different beam intensity increase rate relative to a beam intensity increase rate of a beam profile on a surface which is perpendicular to the proceeding direction of the laser beam, and may have a beam profile which is symmetrical to a center of the laser beam overall.

The beam profile on the surface which is parallel to the proceeding direction of the laser beam may have a beam intensity which decreases from a center portion to an end portion of the laser beam.

A beam profile on the surface which is parallel to the proceeding direction of the laser beam may have a beam intensity which increases from a center portion to an end portion of the laser beam.

The laser beam may be irradiated in the form of a spot beam.

According to another aspect of the present invention, a method of sealing a substrate by irradiating a laser beam onto a sealing unit disposed between a first substrate and a second substrate comprises: forming a sealing unit between the first substrate and the second substrate; irradiating a laser beam onto the sealing unit, wherein a beam intensity of the laser beam increases from a center portion to an end portion of the laser beam on a surface which is perpendicular to a proceeding direction of the laser beam, and a beam intensity in the center portion of the laser beam is half of that at the end portion of the laser beam or less, and the laser beam has a beam profile which is symmetrical to the proceeding direction of the laser beam; and irradiating the laser beam along a sealing line of the sealing unit.

A center portion of the laser beam may be focused on a center line of the sealing line, and the laser beam may be scanned along the center line of the sealing line so as to irradiate the laser beam.

A beam width (BW) of the laser beam may be greater than a width of the sealing unit.

The width (BW) of the laser beam may be ⅔ to 2 times the width of the sealing unit.

The beam width (BW) of the laser beam may be substantially the same as the width of the sealing unit.

A heat flux, which is an integration value of the beam intensity of the laser beam which is scanned and irradiated along a center line of the sealing line, with respect to time, may be greater at an end portion of the sealing unit than at a center portion of the sealing unit.

The sealing unit may comprise a frit.

The laser beam may sequentially include a first section in which a beam intensity slowly increases from a center portion to an end portion of the laser beam and a second section having a greater beam intensity increase rate than the first section.

The laser beam may be symmetrical relative to a surface which is parallel to a proceeding direction of the laser beam.

An inflection point at a boundary between the first section and the second section may be symmetrically distributed with respect to the center portion of the laser beam.

The laser beam may further include a third section which is disposed on an outer portion of the second section, wherein a beam intensity rapidly decreases in the third section.

The laser beam may further comprise a third section which is disposed on an outer portion of the second section, wherein a beam intensity is uniform in the third section.

The laser beam may be irradiated onto the sealing unit in the form of a spot beam along a sealing line.

The laser beam may have a uniform beam intensity on the surface which is parallel to the proceeding direction of the laser beam.

An inflection point, which is at a boundary between the first section and the second section, may be distributed symmetrically relative to the surface which is perpendicular to the proceeding direction of the laser beam.

An inflection point, which is at a boundary between the first section and the second section, may not exist on the surface which is parallel to the proceeding direction of the laser beam.

A cross-section of the laser beam which is irradiated onto the sealing unit may be rectangular along the sealing line.

The laser beam on a surface which is parallel to the proceeding direction of the laser beam may have a different beam intensity increase rate relative to a beam intensity increase rate of a beam profile on a surface which is perpendicular to the proceeding direction of the laser beam, and may have a beam profile which is symmetrical relative to a center of the laser beam overall.

The beam profile on the surface which is parallel to the proceeding direction of the laser beam may have a beam intensity which decreases from a center portion to an end portion of the laser beam.

A beam profile on the surface which is parallel to the proceeding direction of the laser beam may have a beam intensity which increases from a center portion of the laser beam to an end portion of the laser beam.

The laser beam may be irradiated onto the sealing unit in the form of a spot beam along the sealing line.

According to another aspect of the present invention, a method of manufacturing an organic light emitting display device comprises: forming an organic light emitting unit between a first substrate and a second substrate; forming a sealing unit between the first and second substrates so as to surround the organic light emitting unit; aligning the first substrate and the second substrate; irradiating a laser beam onto the sealing unit, wherein a beam intensity increases from a center portion to an end portion of the laser beam on a surface which is perpendicular to a proceeding direction of the laser beam, and the beam intensity at the center portion of the laser beam is half of the beam intensity at the end portion of the laser beam or less, and the laser beam has a beam profile which is symmetrical relative to the proceeding direction of the laser beam; and irradiating the laser beam along a sealing line of the sealing unit.

After focusing the center portion of the laser beam onto a center line of the sealing line, the laser beam may be irradiated onto the center line of the sealing line by scanning along the center line of the sealing line.

The organic light emitting unit may include at least one organic light emitting device in which at least one organic layer, including an emission layer, is interposed between a first electrode and a second electrode.

The laser beam may sequentially include a first section in which a beam intensity slowly increases from a center portion to an end portion of the beam and a second section having a greater beam intensity increase rate than the first section.

The laser beam may be symmetrical relative to a surface which is parallel to the proceeding direction of the laser beam.

The laser beam may have a uniform beam intensity on a surface which is parallel to the proceeding direction of the laser beam.

The laser beam on a surface which is parallel to the proceeding direction of the laser beam may have a different beam intensity increase rate relative to a beam intensity increase rate of a beam profile on a surface which is perpendicular to the proceeding direction of the laser beam, and may have a beam profile which is symmetrical to a center of the laser beam overall.

The sealing unit may comprise a frit.

The frit may form a closed loop so as to surround the organic light emitting unit.

Each edge of the closed loop may be a curve having a predetermined curvature.

Each edge of the closed loop may be right-angled.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
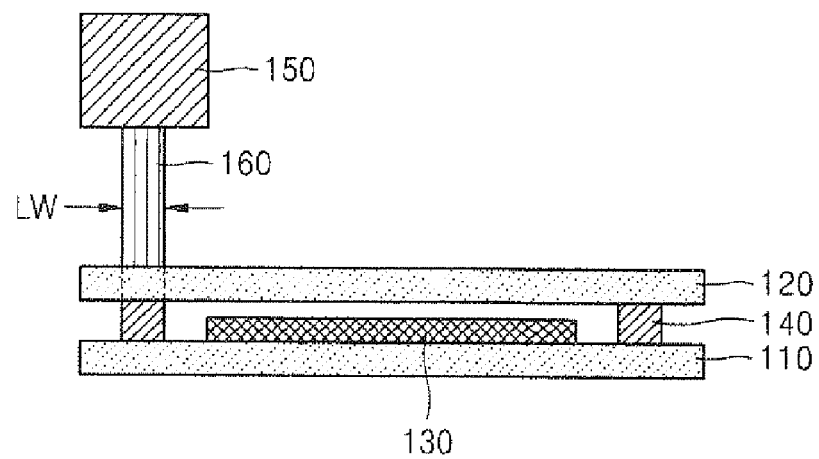
FIG. 1 is a cross-sectional view illustrating a method of sealing a sealing unit of an organic light emitting display device by using a laser beam irradiation apparatus according to an embodiment of the present invention.
Figure 2:
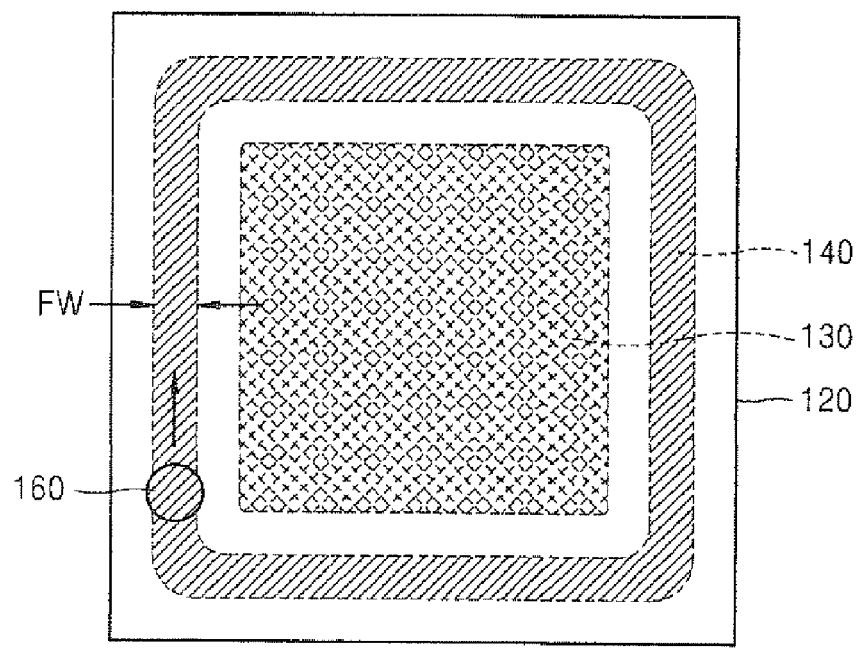
FIG. 2 is a top view of the organic light emitting device of FIG. 1.

FIG. 1 is a cross-sectional view illustrating a method of sealing a sealing unit of an organic light emitting display device by using a laser beam irradiation apparatus according to an embodiment of the present invention, while FIG. 2 is a top view of the organic light emitting device of FIG. 1.

Referring to FIGS. 1 and 2, an organic light emitting unit 130 and a sealing unit 140 which surrounds the organic light emitting unit 130 are disposed between a first substrate 110 and a second substrate 120, and a laser beam 160 irradiated from a laser beam irradiation apparatus 150 is irradiated onto the sealing unit 140.

The organic light emitting unit 130 is formed on the first substrate 110. The first substrate 110 may be a glass substrate.

The second substrate 120 is an encapsulation substrate which encapsulates the organic light emitting unit 130 formed on the first substrate 110, and through which a laser beam to be described later may be transmitted. The second substrate 120 may preferably be a glass substrate.

The organic light emitting unit 130 includes at least one organic light emitting device (OLED) (not shown) in which at least one organic layer (not shown) including an emission layer is interposed between a first electrode (not shown) and a second electrode (not shown). The first electrode (not shown) and the second electrode (not shown) may function as an anode for injecting holes and a cathode for injecting electrons, respectively.

The OLED (not shown) may be classified as a passive matrix (PM) OLED and an active matrix (AM) OLED according to whether the OLED is driven using a thin film transistor (TFT) or not. According to the current embodiment of the present invention, both the PM type and AM type OLED may be used.

The sealing unit 140 is disposed on the second substrate 120 so as to surround the above-described organic light emitting unit 130.

The sealing unit 140 may be a closed loop in order to prevent contact between the organic light emitting unit 130 and water or oxygen from the outside.

Edges of the sealing unit 140 forming the closed loop in FIG. 2 are curved with a predetermined curvature but the current embodiment of the present invention is not limited thereto. That is, the edges of the sealing unit 14 may be right-angled without any curvature.

When each of the edges of the sealing unit 140 has a predetermined curvature, a head (not shown) including an optical system (not shown) of the laser beam irradiation apparatus 150 may be directly and continuously scanned along a sealing line including the edges of the sealing unit 140, thereby irradiating a laser beam 160.

When the edges of the sealing unit 140 are right-angled, the head (not shown) of the laser beam irradiation apparatus 150 may be scanned along a first edge of the sealing unit 140 in a first direction so as to irradiate the laser beam 160, and a stage under the first substrate 110, which is not illustrated in FIG. 1, is also rotated by 90 degrees. When the stage rotates, the first substrate 110 and the second substrate 120 are also rotated with the stage. After rotating the stage, the laser beam 160 is scanned and irradiated in the above-described first direction, and thus the laser beam 160 is irradiated onto a second edge of the sealing unit 140. The sealing unit 140 may be sealed by irradiating the laser beam 160 while rotating the stage (not shown) in the above-described manner.

According to the current embodiment, the sealing unit 140 is formed of a frit so as to provide tightness between the first substrate 110 and the second substrate 120 and so as to effectively protect the organic light emitting unit 130. The frit is formed so as to have a predetermined frit width (FW) by using various methods, such as a screen printing method or a pen dispensing method.

According to the current embodiment, the sealing unit 140 is formed on the second substrate 120, and the organic light emitting unit 130 is formed on the first substrate 110 so as to align the first substrate 110 and the second substrate 120, but the present invention is not limited thereto. For example, the sealing unit 140 may be formed on the first substrate 110, on which the organic light emitting unit 130 is formed, and may be aligned with and adhered to the second substrate 120.

Although one organic light emitting unit 130 is illustrated in FIGS. 1 and 2, a plurality of the organic light emitting units 130 and a plurality of the sealing units 140 which surround the plurality of organic light emitting units 130 may also be disposed between the first substrate 110 and the second substrate 120.

The laser beam irradiation apparatus 150 irradiates the laser beam, in the form of a spot beam having a beam profile according to the current embodiment of the present invention, onto the sealing unit 140 which is disposed between the first substrate 110 and the second substrate 120. This beam irradiation will be described in detail later.

Although not shown in detail in FIGS. 1 and 2, the laser beam irradiation apparatus 150 may include a laser oscillator (not shown) which generates a laser, a beam homogenizer (not shown), and a scanner (not shown).

The laser oscillator may be a bundle type multi core source, which is a high output laser source typically used for laser sealing.

When using the bundle type multi-core source, the output of each of cores may vary, and thus the above non-uniform outputs may be solved by using the beam homogenizer (not shown).

The scanner (not shown) may include a reflecting unit (not shown) which reflects a laser beam which is irradiated from the laser oscillator so as to irradiate the laser beam onto the sealing unit 140, a driving unit (not shown) which drives the reflecting unit, and a lens unit (not shown) which collects the reflected laser beam.

The laser beam 160 which is transmitted through the lens unit (not shown) is irradiated onto the sealing unit 140 in the form of a spot beam having a beam profile according to an embodiment of the present invention. The lens unit (not shown) may be disposed in the scanner or under the scanner so as to be oriented toward the sealing unit 140.

Although not shown in FIGS. 1 and 2, when a width LW of the laser beam 160 irradiated from the laser irradiation apparatus 150 is greater than a width FW of the sealing unit 140, a laser mask (not shown) is disposed between the laser beam irradiation apparatus 150 and the second substrate 120 so as to adjust the width LW of the laser beam 160 irradiated onto the width FW of the sealing unit 140.

Figure 3:
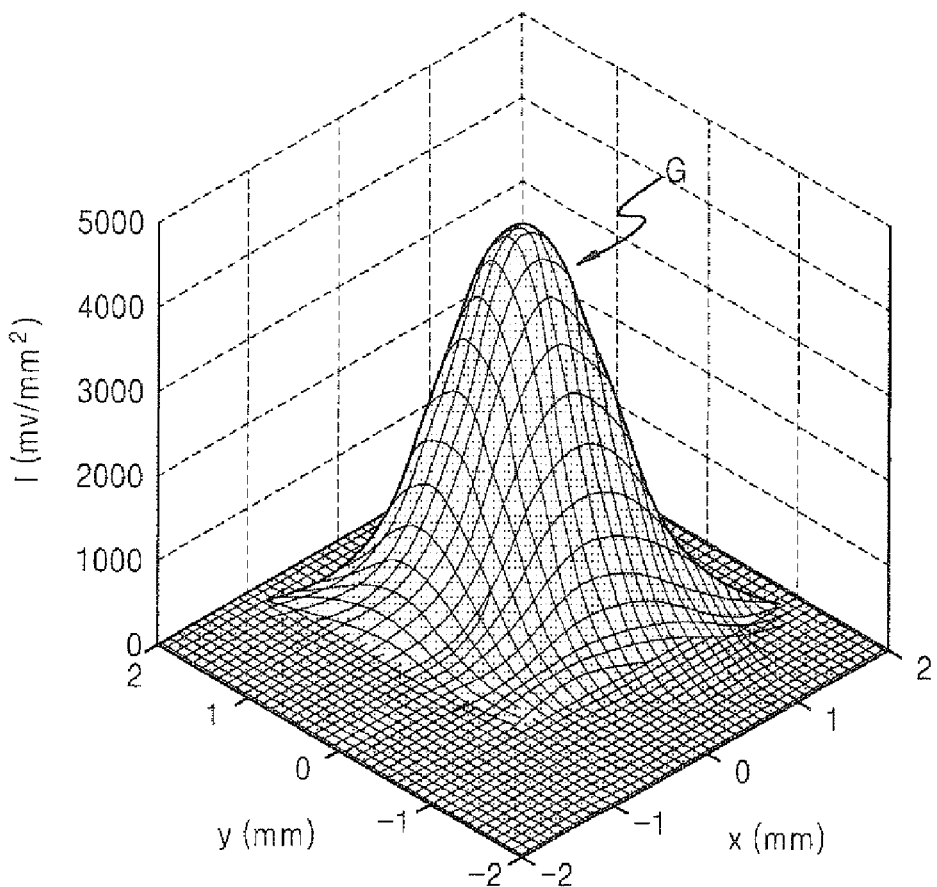
FIG. 3 illustrates a Gaussian beam profile according to a comparative example for comparison with a beam profile which is irradiated from a laser beam irradiation apparatus according to an embodiment of the present invention.
Figure 4:
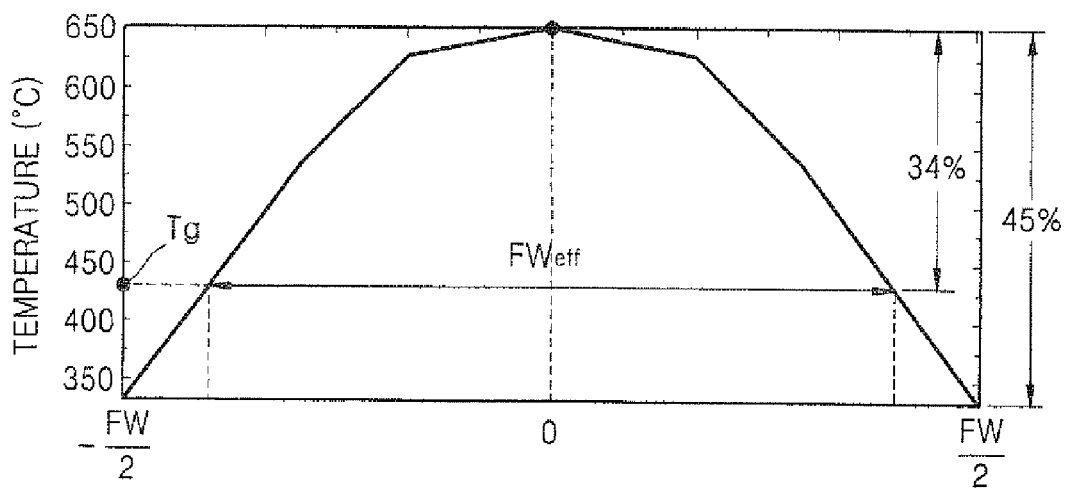
FIG. 4 illustrates a temperature distribution according to a cross-section of a frit when the Gaussian beam profile of FIG. 3 is irradiated onto the frit of an organic light emitting display device.

FIG. 3 illustrates a Gaussian beam profile according to a first comparative example for comparison with a beam profile which is irradiated from a laser beam irradiation apparatus according to an embodiment of the present invention, while FIG. 4 illustrates a temperature distribution according to a cross-section of a frit when the Gaussian beam profile of FIG. 3 is irradiated onto the frit of an organic light emitting display device.

Referring to FIG. 3, a beam intensity (I) of the Gaussian beam profile G having a Gaussian distribution per unit surface increases toward a center portion of a beam, and the Gaussian beam profile G has an axis-symmetrical distribution.

In the graph of FIG. 3, x and y on the plane refer to horizontal and vertical dimensions, respectively, of a beam profile and, even when a portion of the Gaussian beam profile (G) around a central axis is cut using a laser mask, there is still a difference of about 15% or more between a center portion of the Gaussian beam profile and a peripheral portion thereof which is cut using the laser mask.

When irradiating a laser beam, which has a difference in beam intensity between the center portion and the peripheral portion of the beam profile onto a frit which constitutes the sealing unit 140, there is a temperature difference of 45% or more between a center portion of the frit (at 0 on the horizontal axis) and an end portion of the frit (at ±FW/2 on the horizontal axis) as illustrated in FIG. 4, and there is a temperature difference of 34% maximum between the center portion and the end portion of the frit within an effective sealing width FWeff which corresponds to 80% of a total sealing width FW.

A laser output needs to be increased to maintain the end portion of the frit at a transition temperature (Tg) of the frit, that is, at 430° C. or higher and, in this case, a temperature of the center portion of the frit which is sealed by the center portion of the Gaussian beam profile increases to about 650° C. or higher, and thus excessive heat is generated, and thus the frit reaches an over-welding state.

Then, small voids which exist on the center portion of the frit to which excessive energy is irradiated expand beyond the end portion of the frit, and the expanded small voids are rapidly cooled again, leaving marks which appear to be boiling bubbles. These bubble marks significantly decrease the adhesive force of the organic light emitting display device.

Residual stress is determined by a heat expansion rate and a difference in the temperature of the frit between the center portion and the end portion of the frit, temperatures of which are reduced, and since the center portion of the frit, which is heated to a higher temperature than the end portion of the frit, is cooled later than the end portion of the frit, tensile stress of the center portion of the frit is increased, and thus cracks may be generated in the frit when an impact from the outside occurs.

In order to solve this problem, irradiation of a laser beam having a profile with a uniform beam intensity onto the frit may be considered.

Figure 5:
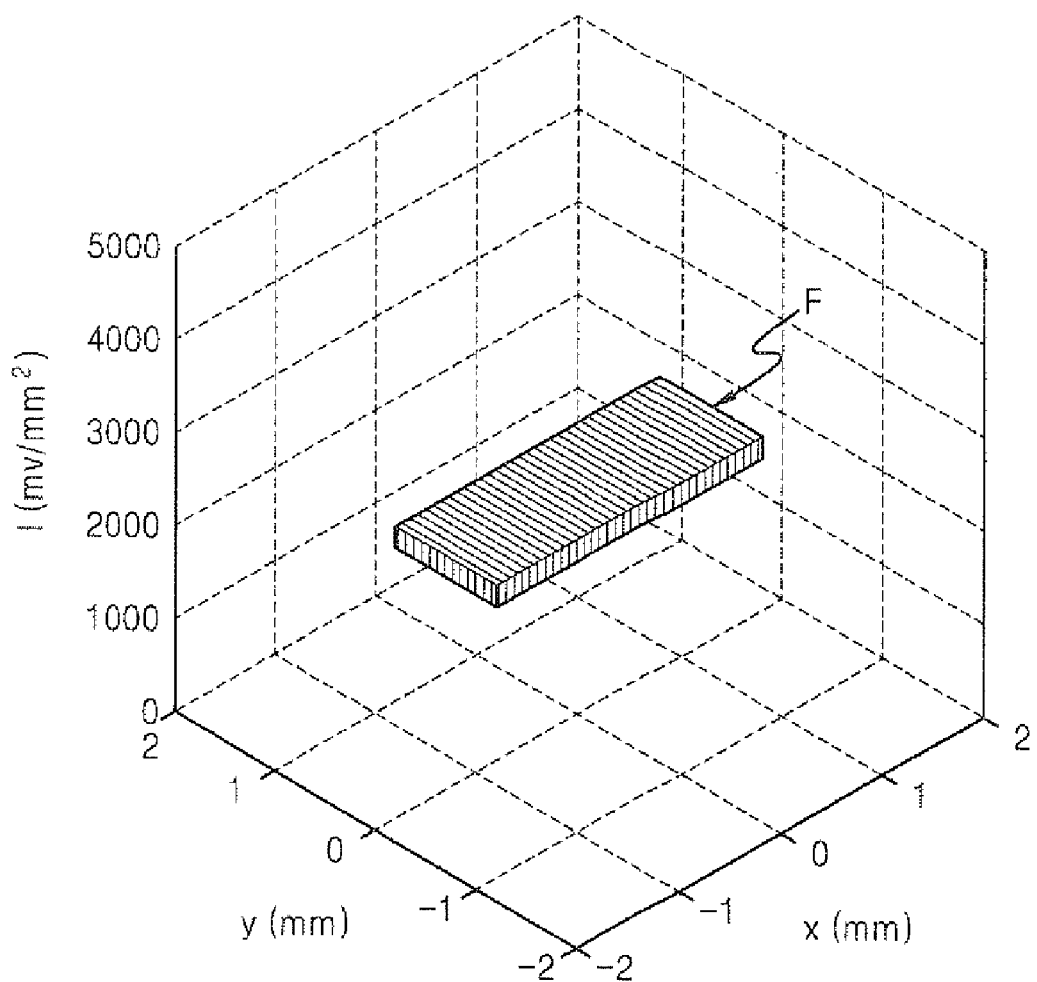
FIG. 5 illustrates a flat top beam profile which is a second comparative example for comparison with a beam profile which is irradiated from a laser beam irradiation apparatus according to an embodiment of the present invention.
Figure 6:
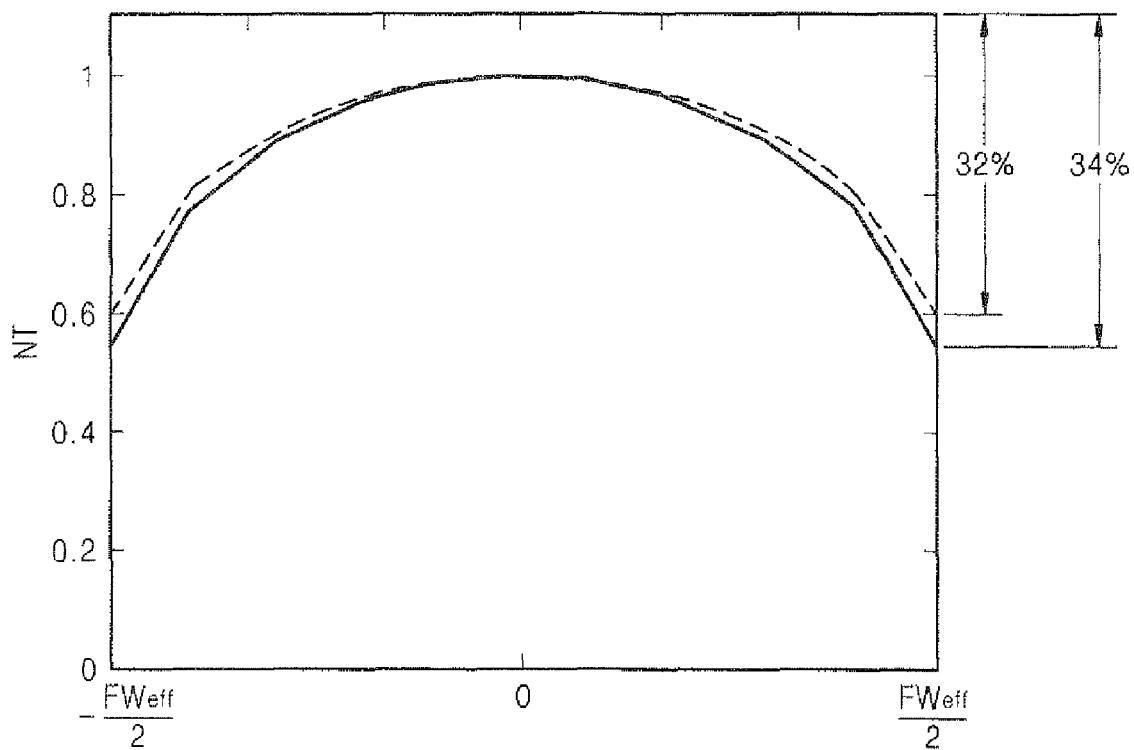
FIG. 6 illustrates normalization of temperature distribution according to a cross-section of a frit within an effective sealing width FWeff when the flat top beam profile of FIG. 5 and the Gaussian beam profile of FIG. 3 are irradiated onto the fit of the organic light emitting display device.

FIG. 5 illustrates a flat top beam profile, which is a second comparative example for comparison with a beam profile which is irradiated from a laser beam irradiation apparatus according to an embodiment of the present invention, and FIG. 6 illustrates normalization of temperature distribution in a cross-section of a frit within an effective sealing width FWeff when the flat top beam profile of FIG. 5 and the Gaussian beam profile of FIG. 3 are irradiated onto the frit of the organic light emitting display device.

Referring to FIG. 5, a laser beam profile F having a flat top distribution has a brick-shaped distribution in which beam intensities (I) of a center portion of a beam and a peripheral portion of the beam per unit surface are uniform.

A horizontal axis of FIG. 6 denotes a position of the frit within the effective sealing width FWeff, and a vertical axis NT denotes normalization of temperature. Referring to FIG. 5 and FIG. 6, even when the flat top laser beam F having a uniform beam intensity is irradiated onto the frit, the temperature uniformity of a cross-section of the frit is reduced from 34% to 32%, that is, by just about 2%, which indicates that the temperature uniformity is barely improved.

This is because heat is more easily dissipated along the end portion of the frit than the center portion of the frit. In order to solve the above problem, the uniform beam intensity of a laser beam irradiated onto the frit is not needed but, rather, the temperature distribution in the cross-section of the frit needs to be adjusted to be uniform after the laser beam has been irradiated. To this end, a larger amount of energy needs to be additionally supplied to the end portion of the frit than to the center portion of the frit.

Hereinafter, laser beam profiles, which may be used to improve temperature distribution uniformity of a cross-section of a frit by using a laser beam irradiation apparatus according to embodiments of the present invention when sealing a substrate of an organic light emitting display device, will be described with reference to FIGS. 7 thru 34.

Embodiment 1

Figure 7:
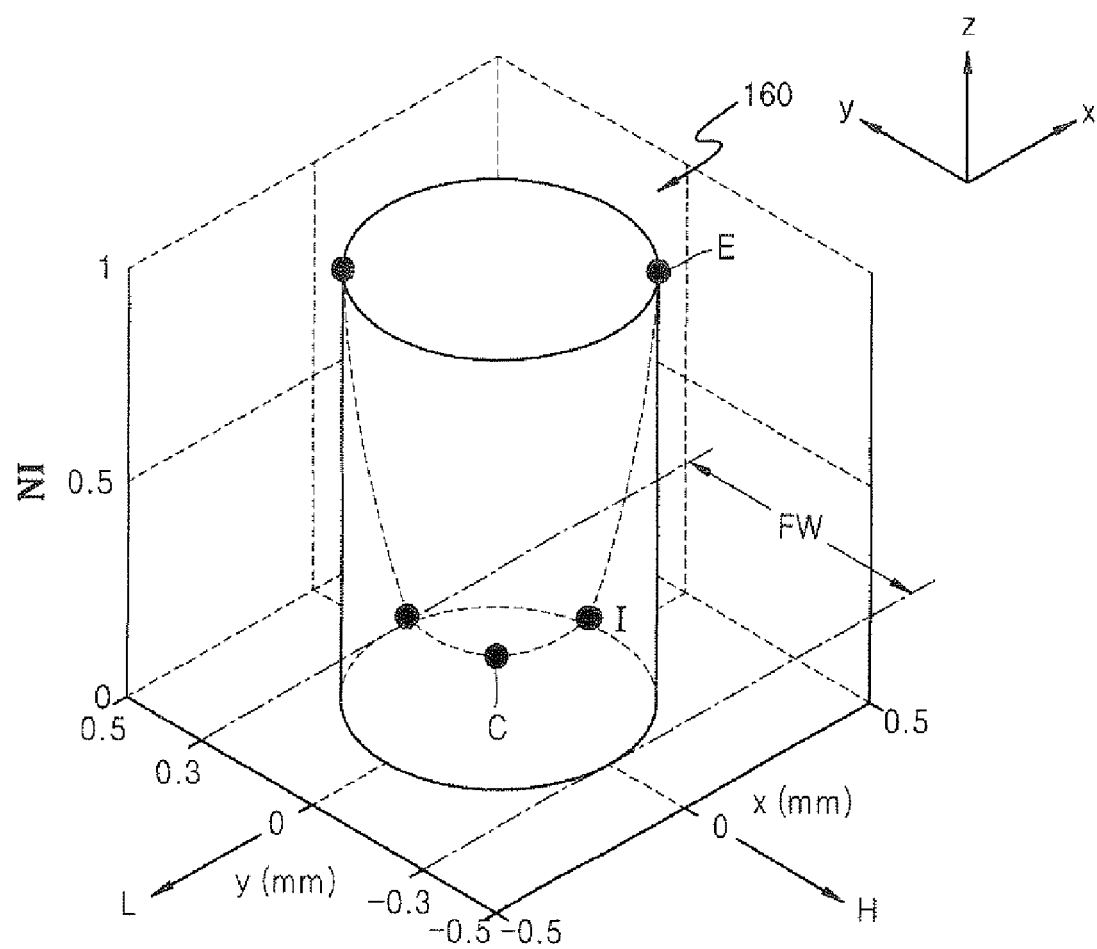
FIG. 7 is a schematic view illustrating a beam profile of a laser beam which is irradiated onto a frit of an organic light emitting display device from a laser beam irradiation apparatus according to an embodiment of the present invention.
Figure 8:
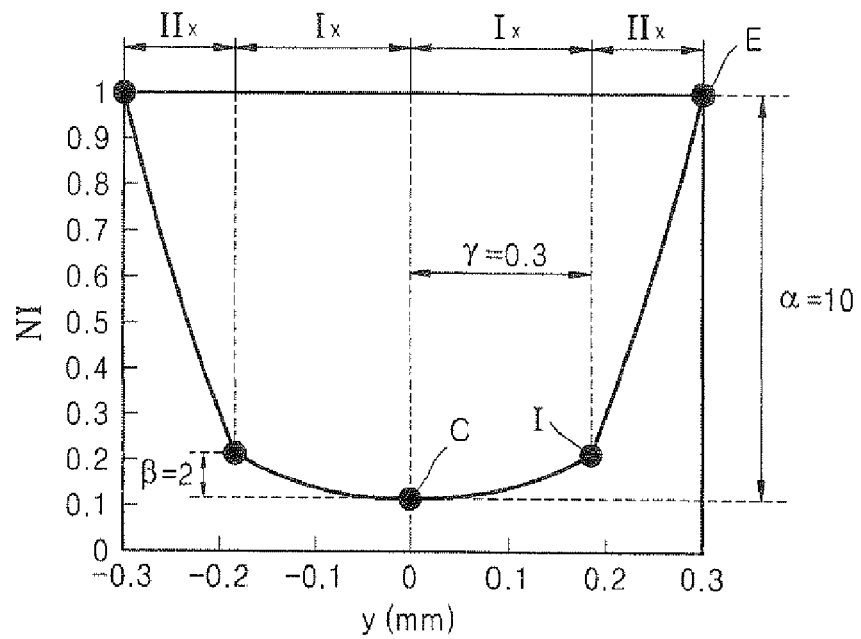
FIG. 8 is a cross-sectional view illustrating a surface (yz surface) of the beam profile of FIG. 7 which is perpendicular to a proceeding direction of a laser beam.
Figure 9:
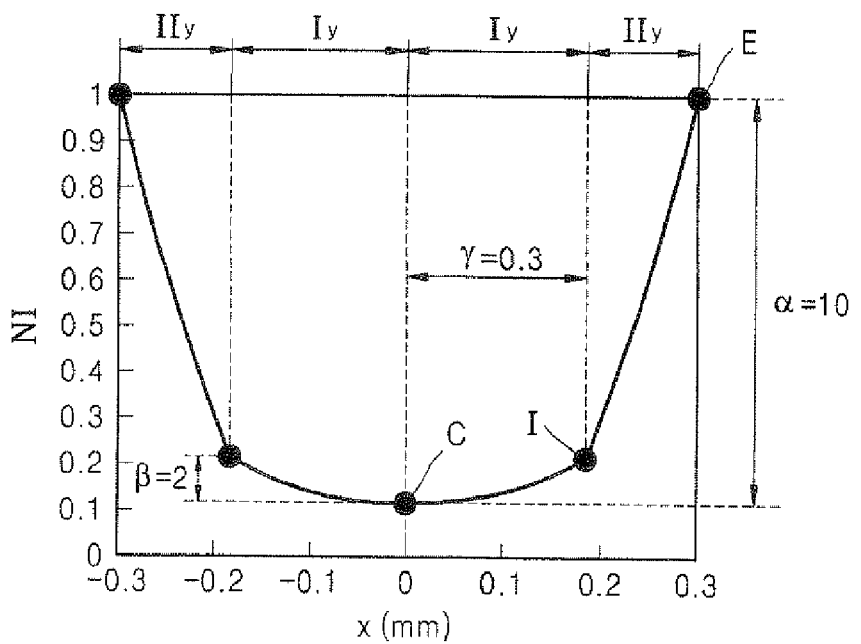
FIG. 9 is a cross-sectional view illustrating a surface (xz surface) of the beam profile of FIG. 7 which is parallel to a proceeding direction of a laser beam.
Figure 10:
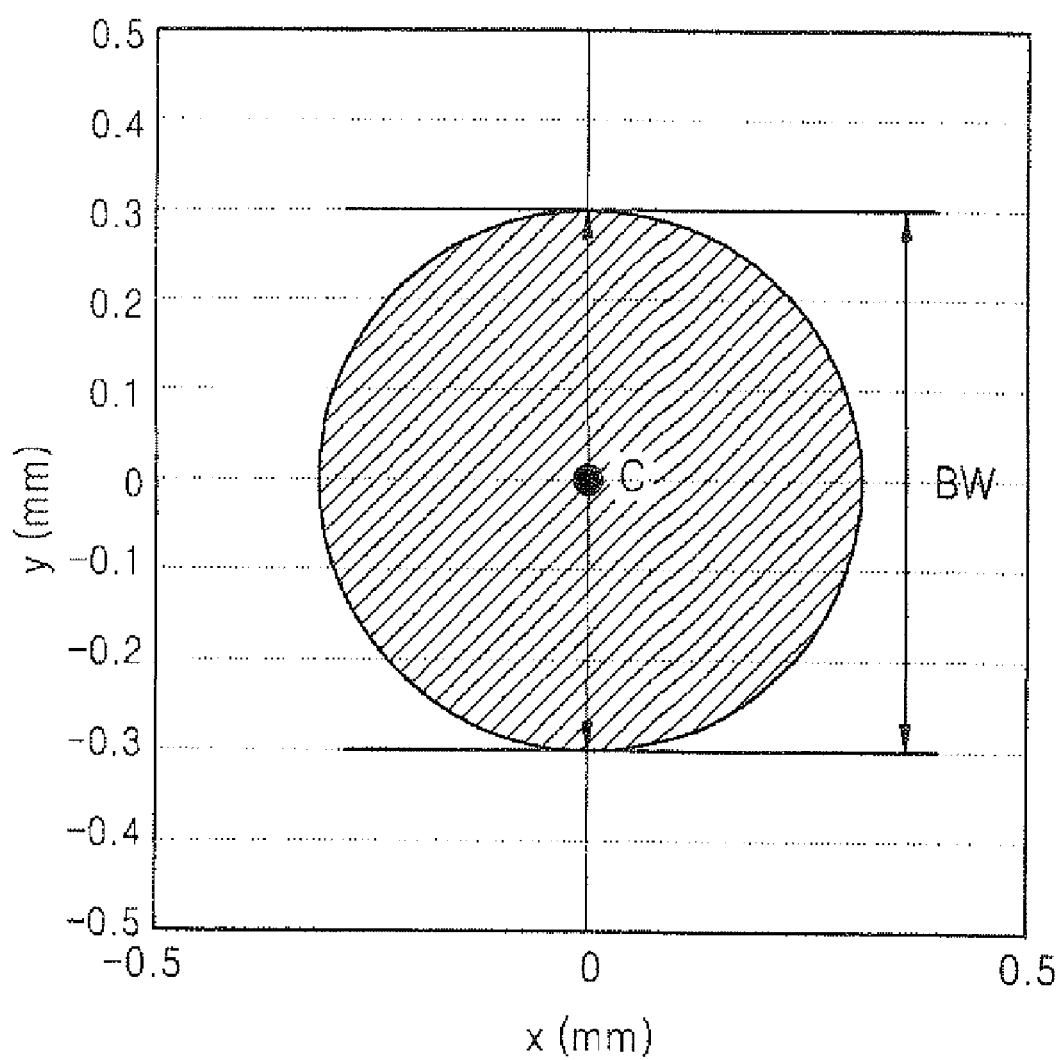
FIG. 10 is a top view of the beam profile of FIG. 7.

FIG. 7 is a schematic view illustrating a beam profile of a laser beam which is irradiated onto a frit of an organic light emitting display device from a laser beam irradiation apparatus according to an embodiment of the present invention, FIG. 8 is a cross-sectional view illustrating a surface (yz surface) of the beam profile of FIG. 7 which is perpendicular to a proceeding direction of a laser beam, FIG. 9 is a cross-sectional view illustrating a surface (xz surface) of the beam profile of FIG. 7 which is parallel to a proceeding direction of a laser beam, and FIG. 10 is a top view of the beam profile of FIG. 7.

A horizontal axis (x) and a vertical axis (y) denote positions of a beam profile with respect to a frit width (FW), and a height (normalized intensity, NI) denotes normalization of beam intensity.

Referring to FIGS. 7 thru 10, a laser beam 160 which is irradiated onto frit 140 of the organic light emitting display apparatus in the laser beam irradiation apparatus 150 according to the current embodiment of the present invention has a profile in which beam intensity increases toward an end portion (E) of a beam. The beam intensity in a center portion (C) of the beam may preferably be half of the beam intensity at the end portion (E) of the beam or less.

The profile of the laser beam 160 according to the current embodiment of the present invention is symmetrical with respect to a laser beam proceeding direction (L) and a direction (H) which is perpendicular to the laser beam proceeding direction.

The profile of the laser beam 160 includes a first section (Ix, Iy) in which a beam intensity slowly increases from a center portion (C) of the beam toward an end portion (E) of the beam, and a second section (IIx, IIy) in which an increase rate of the beam intensity of the first section is greater.

The profile of the laser beam 160 according to the current embodiment of the present invention includes an inflection point (I) which is symmetrical relative to a center portion (C) of a laser beam at a boundary between the first section (Ix, Iy) and the second section (IIx, IIy).

The inflection point (I) may be defined by parameters $\alpha$, $\beta$, and $\gamma$, where $\alpha$ denotes a ratio of greatest beam intensity with respect to smallest beam intensity. According to the current embodiment, the smallest beam intensity is 0.1 in the center portion (C) of the beam, and the greatest beam intensity is 1.0 at an end portion (E) of the laser beam, and thus a becomes 10. $\beta$ denotes a ratio of beam intensity at an inflection point with respect to the smallest beam intensity. According to the current embodiment, the smallest beam intensity is 0.1 in the center portion (C) of the beam, and the beam intensity at the inflection point (I) is 0.2, and thus $\beta$ becomes 2. $\gamma$ denotes a ratio of horizontal distances between the center portion of the beam and the inflection point (I) with respect to the total beam width. According to the current embodiment, the total beam width is 0.6 mm, and a horizontal distance between the center portion of the laser beam and the inflection point (I) is 0.18 mm, and thus $\gamma$ becomes 0.3.

Referring to FIG. 10, which is a top view of the beam profile according to the current embodiment, the laser beam 160 is symmetrical relative to a laser beam proceeding direction (L) and a direction (H) which is perpendicular to the laser beam proceeding direction, and thus a beam width (BW) is also symmetrical relative to the laser beam proceeding direction (L) and the direction (H) which is perpendicular to the laser beam proceeding direction. Accordingly, the laser beam 160 may be irradiated in the form of a spot having a circular cross-section.

The laser beam 160 is irradiated in the form of a spot beam and may be moved while scanning along a sealing line of the sealing unit 140. In this regard, a center line of the laser beam 160 is focused on a center line of the sealing line, and the laser beam 160 is scanned along the center line of the sealing line.

Accordingly, when irradiating the laser beam 160 having a beam profile, the intensity of which increases from the center portion (C) of the beam toward the end portion (E) of the beam to the sealing unit 140, a heat flux, which is an integration value of an intensity of a laser beam irradiated along the center line of the sealing line regarding time, is greater at the end portion of the sealing unit 140 than at the center portion of the sealing unit 140. Consequently, greater energy is supplied to the end portion of the sealing unit 140 than to the center portion of the sealing unit 140, and thus the temperature uniformity of a cross-section of the frit may be increased.

The sealing unit 140 may be formed of a frit.

A laser beam width (BW) may be designed to be substantially the same as a frit width (FW). According to the current embodiment, the laser beam width (BW) and the frit width (FW) are both 600 μm. However, the present invention is not limited thereto. Thus, the beam width (BW) of the laser beam 160 may be greater than the frit width (FW). However, when the beam width (BW) is too large, then, even when the laser beam 160 is blocked using a laser mask (not shown), energy transmitted to the laser mask is increased, and a wiring unit around the frit or an organic light emitting unit 130 may be damaged, and thus the beam width (BW) may preferably be twice the frit width (FW) or less.

Figure 11:
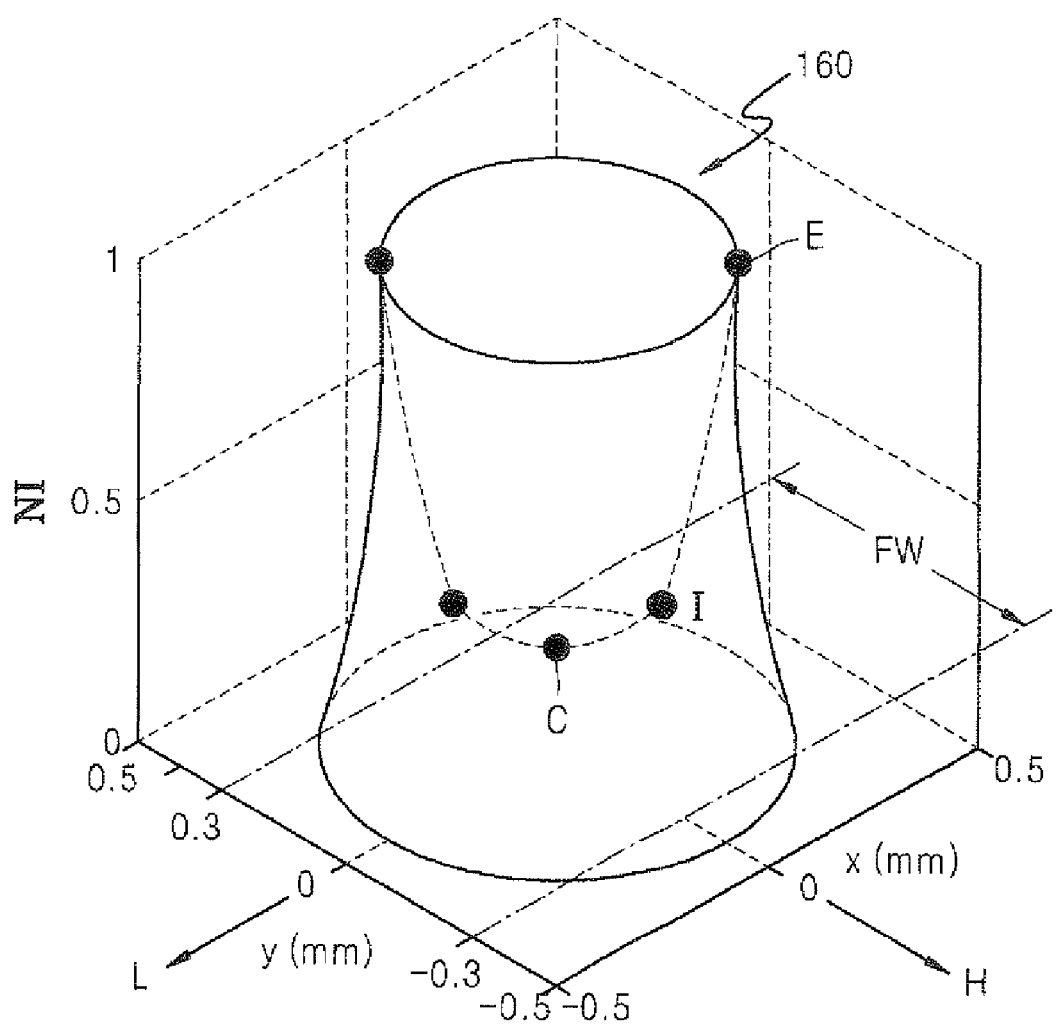
FIG. 11 is a schematic view illustrating a laser beam profile according to a modified example of the present invention.
Figure 12:
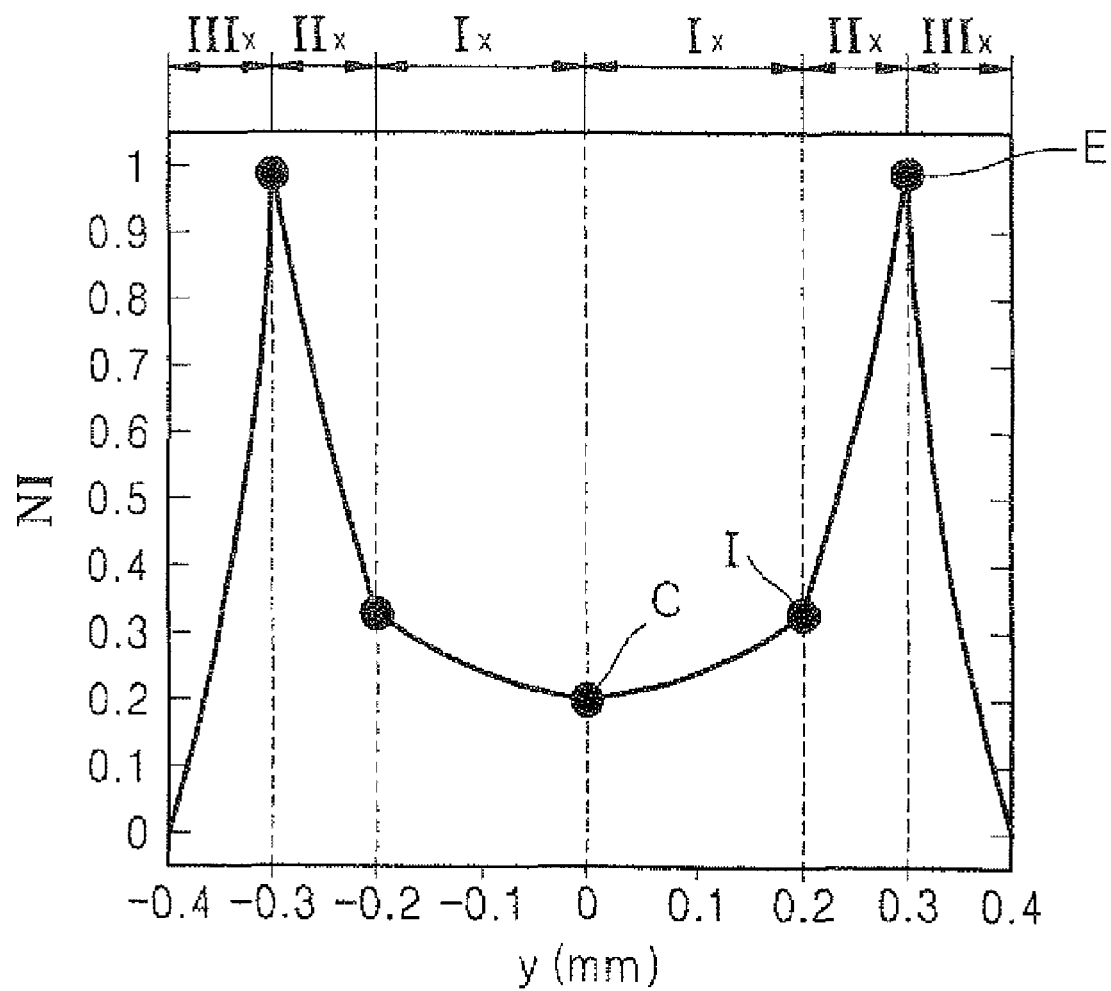
FIG. 12 is a cross-sectional view of a surface (yz surface) of the beam profile of FIG. 11 which is perpendicular to a proceeding direction of the laser beam of FIG. 11.

FIG. 11 is a schematic view illustrating a laser beam profile according to a modified example of the present invention, while FIG. 12 is a cross-sectional view of a surface (yz surface) of the beam profile of FIG. 11 which is perpendicular to a laser beam proceeding direction of FIG. 11.

The laser beam 161 also has a beam profile which is symmetrical relative sto a laser beam proceeding direction (L) and a direction (H) which is perpendicular to the laser beam proceeding direction (L), as in the previously described embodiment. In FIG. 11, only a cross-sectional view of a surface (yz surface) in which a beam intensity is perpendicular to the laser beam proceeding direction (L) is illustrated.

The laser beam 161 sequentially includes, from a center portion (C) of the laser beam to an end portion (E) of the laser beam, a first section (Ix) in which a beam intensity is slowly increased, a second section (IIx) in which a beam intensity increase rate is larger than in the first section, and a third section (IIIx) in which a beam intensity rapidly decreases on an outer portion of the second section (IIx, IIy).

The laser beam width (BW) according to the current embodiment is 800 μm, which is greater than the frit width (FW) of 600 μm.

Figure 13:
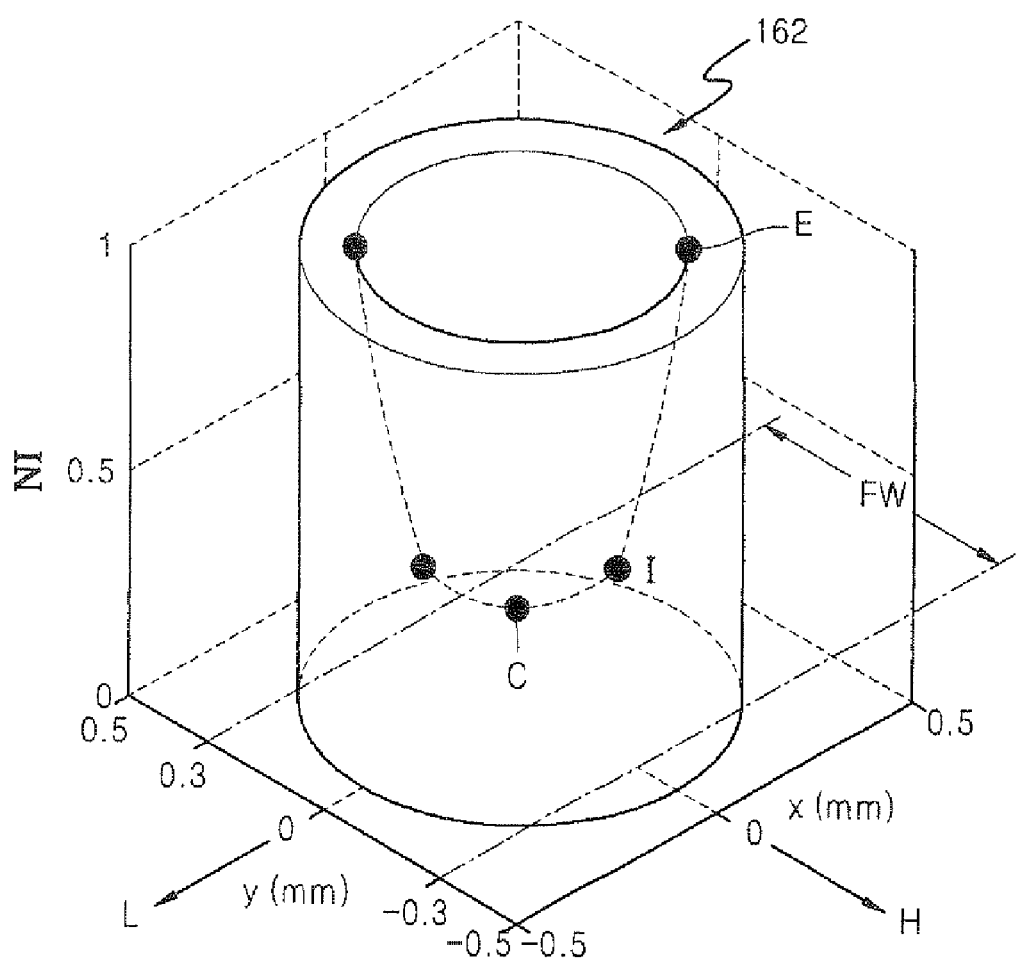
FIG. 13 is a schematic view illustrating a laser beam profile according to another embodiment of the present invention.
Figure 14:
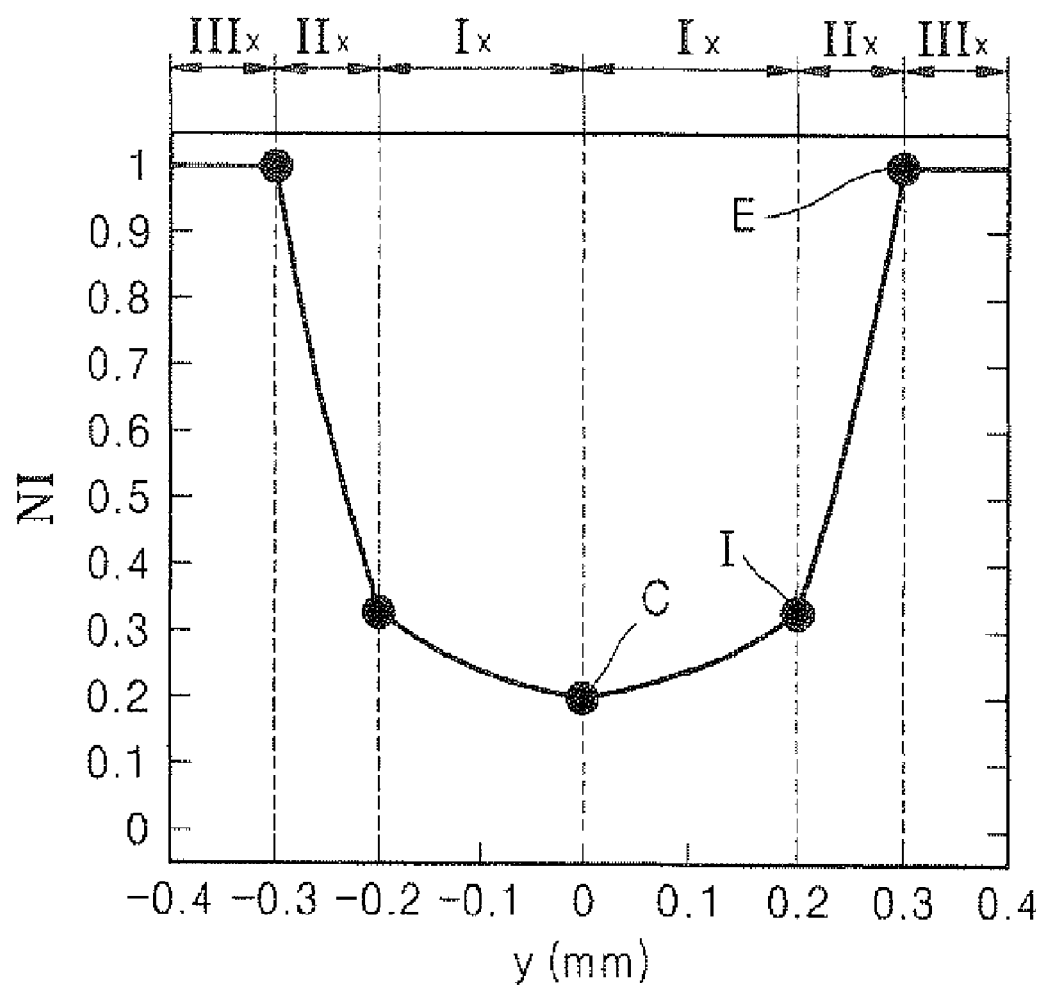
FIG. 14 is a cross-sectional view illustrating a surface (yz surface) of the beam profile of FIG. 13 which is perpendicular to a proceeding direction of the laser beam of FIG. 13.

FIG. 13 is a schematic view illustrating a laser beam profile according to another embodiment of the present invention, while FIG. 14 is a cross-sectional view illustrating a surface (yz surface) of the beam profile of FIG. 13 which is perpendicular to a proceeding direction of the laser beam.

The laser beam 162 also has a beam profile which is symmetrical relative to a laser beam proceeding direction (L) and a direction (H) which is perpendicular to the laser beam proceeding direction (L), as in the previously described embodiment. In FIG. 13, only a cross-sectional view of a surface (yz surface) in which a beam intensity is perpendicular to the laser beam proceeding direction (L) is illustrated.

The laser beam 162 sequentially includes, from a center portion (C) of the laser beam to an end portion (E) of the laser beam, a first section (Ix) in which a beam intensity is slowly increased, a second section (IIx) in which a beam intensity increase rate is larger than in the first section, and a third section (IIIx) in which a beam intensity is uniform on an outer portion of the second section (IIx, IIy).

According to the current embodiment, a laser beam width (BW) is 800 μm, which is greater than the fit width (FW) of 600 μm.

Figure 15:
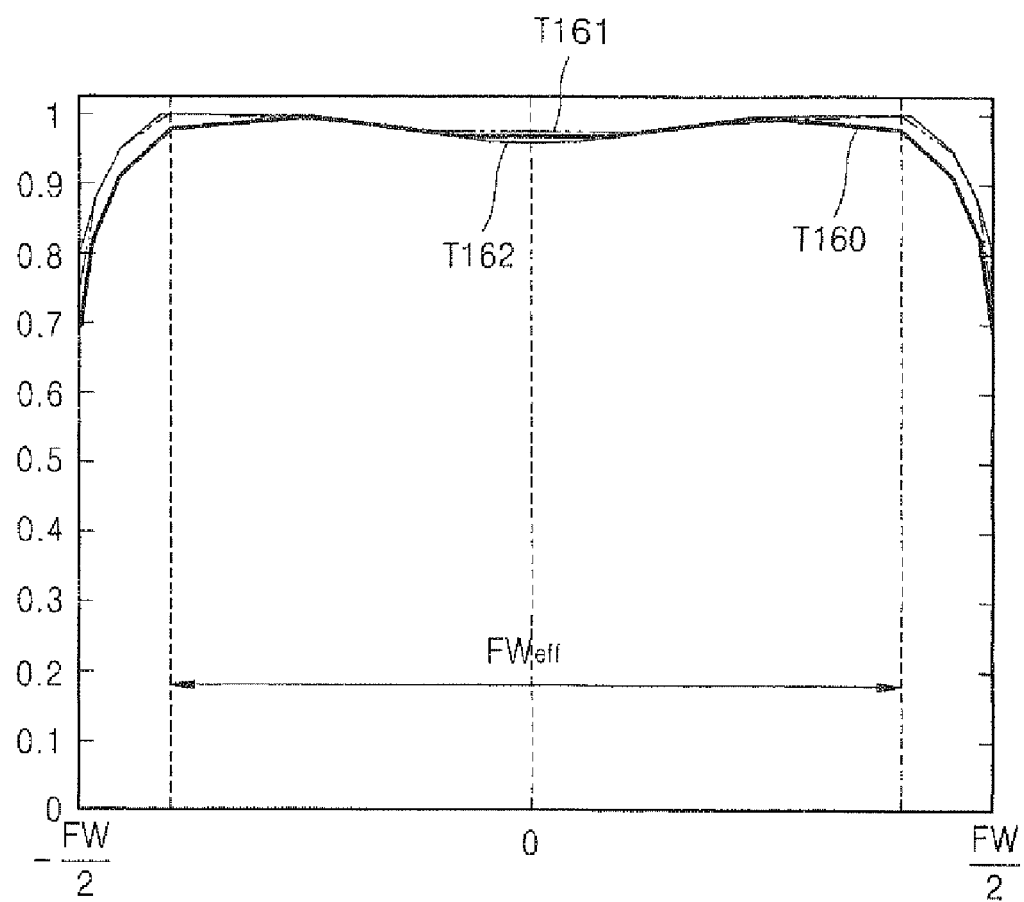
FIG. 15 is a graph of the normalization of temperature distribution according to a cross-section of a frit when laser beams having the beam profiles of FIGS. 7, 11, and 13 are irradiated onto the fit.

FIG. 15 is a graph of the normalization of temperature distribution along a cross-section of a frit when a laser beam having the beam profile of FIGS. 7, 11, and 13 is irradiated onto the frit.

Referring to FIG. 15, in a temperature distribution (T160) with respect to the laser beam 160 having the beam profile of FIG. 7, there is a temperature difference of 30% between a center portion and an end portion of the frit, and there is a temperature difference of less than 3% between the center portion and the end portion of the frit within an effective sealing width (FWeff).

In a temperature distribution (T161) with respect to the laser beam 161 having the beam profile of FIG. 11, there is a temperature difference of 25% between a center portion and an end portion of the frit, and there is a temperature difference of less than 3% between the center portion and the end portion of the frit within an effective sealing width (FWeff).

In a temperature distribution (T162) having the beam profile of FIG. 13, there is a temperature difference of 25% between a center portion and an end portion of the frit, and there is a temperature difference of less than 3% between the center portion and the end portion of the frit within an effective sealing width (Fweff).

Regarding the Gaussian beam profiles of FIGS. 3 and 4, there is a temperature difference of 45% or greater between the center portion and the end portion of the fit, and within an effective sealing width (FWeff), there is a maximum temperature difference of maximum 34% between the center portion and the end portion of the fit. Also, when a laser beam having the beam profiles according to the current embodiment and modified examples are irradiated, the uniformity in the temperature distribution along the end portion of the frit is improved.

Figure 16:
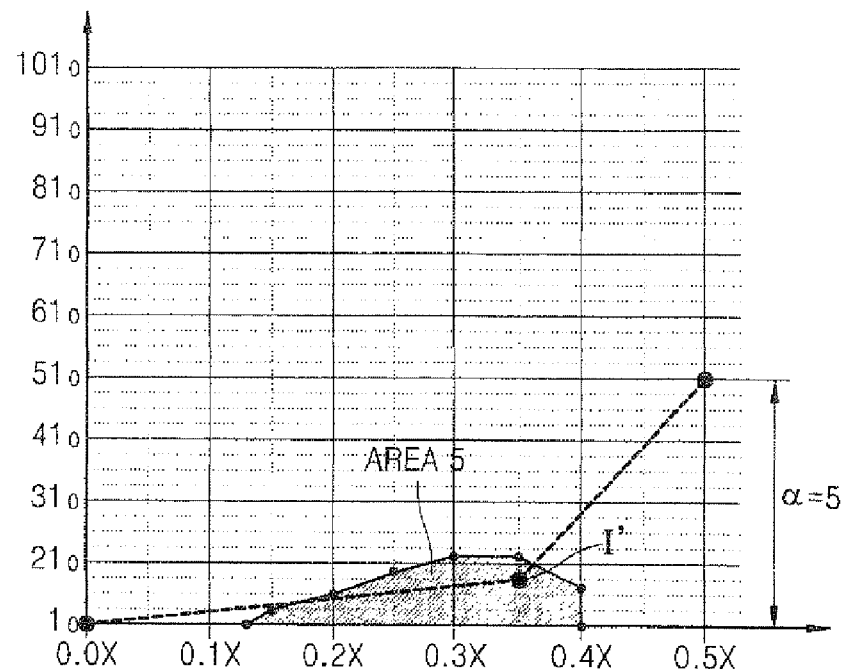
FIGS. 16 and 17 illustrate a variation of an area of an inflection point for maintaining a temperature difference between a center portion and an end portion of a frit so as to be less than 15% within an effective sealing width (FWeff) according to a variation of $\alpha$.
Figure 17:
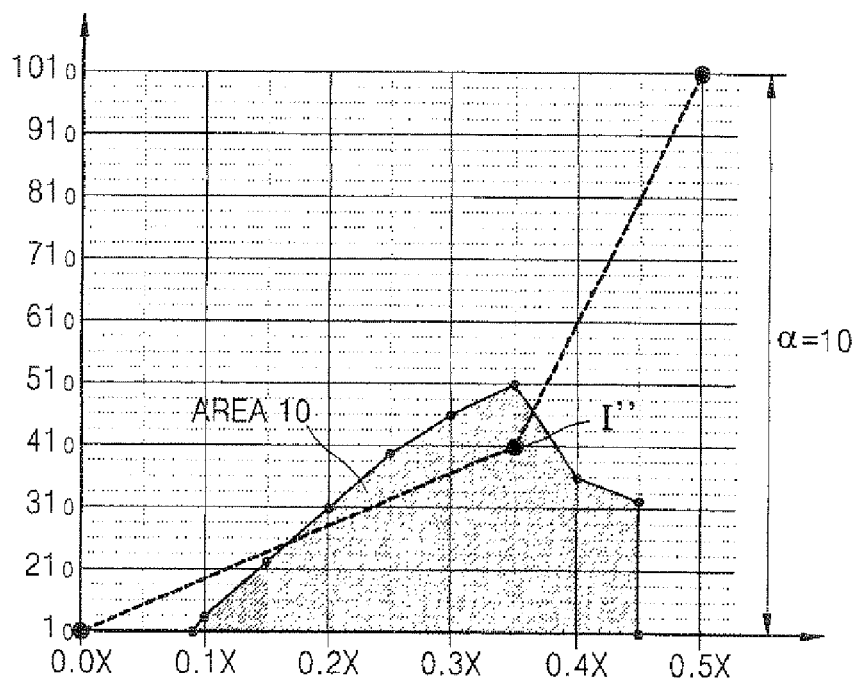

FIGS. 16 and 17 illustrate a variation in an area of an inflection point for maintaining a temperature difference between a center portion and an end portion of a frit so as to be less than 15% within an effective sealing width (FWeff) according to a variation of α.

FIG. 16 illustrates an area AREA5 where an inflection point (I') may exist when a laser beam having a parameter α of 5 is irradiated at a scanning speed of 20 mm/sec, and FIG. 17 illustrates an area AREA10 where an inflection point (I") may exist when a laser beam having a parameter α of 10 is irradiated at a scanning speed of 20 mm/sec.

Referring to FIGS. 16 and 17, when the scanning speeds are the same, the areas of the inflection points are increased as α increases. Accordingly, as the areas of the inflection points increase, a selection width of β and γ are also increased, and thus the freedom degree of selection for parameters of a laser beam for improving temperature uniformity of an end portion of the frit is increased.

Although not shown in FIGS. 16 and 17, when the scanning speed of the laser beam is increased while other conditions are the same, the areas for selecting an inflection point are increased. However, when the beam scanning speed is 5 mm/sec or less, the fit may be sealed using an appropriate laser power but the processing efficiency is decreased due to an increased tag time. On the other hand, when the beam scanning speed is 50 mm/sec or greater, the intensity of the beam needs to be increased to obtain an appropriate temperature at which the frit melts compared to when the beam scanning speed is 5 mm/sec, and also, a possibility that microcracks are generated due to thermal shock which is generated as the frit melts and then is solidified due to the high speed of the beam increasing. Considering this, the scanning speed of the beam may preferably be higher than 5 mm/sec and lower than 50 mm/sec.

Embodiment 2

Figure 18:
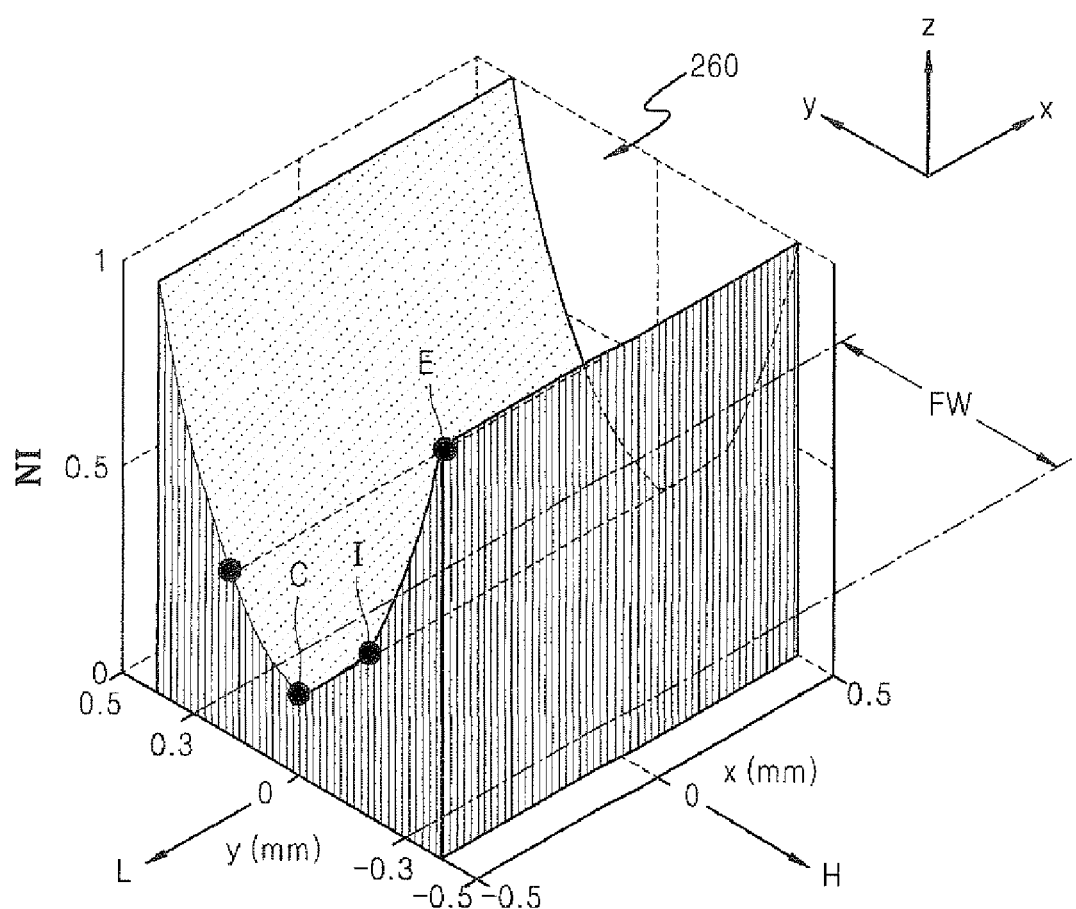
FIG. 18 is a schematic view illustrating a beam profile of a laser beam which is irradiated onto a frit of an organic light emitting display device in a laser beam irradiation apparatus according to another embodiment of the present invention.
Figure 19:
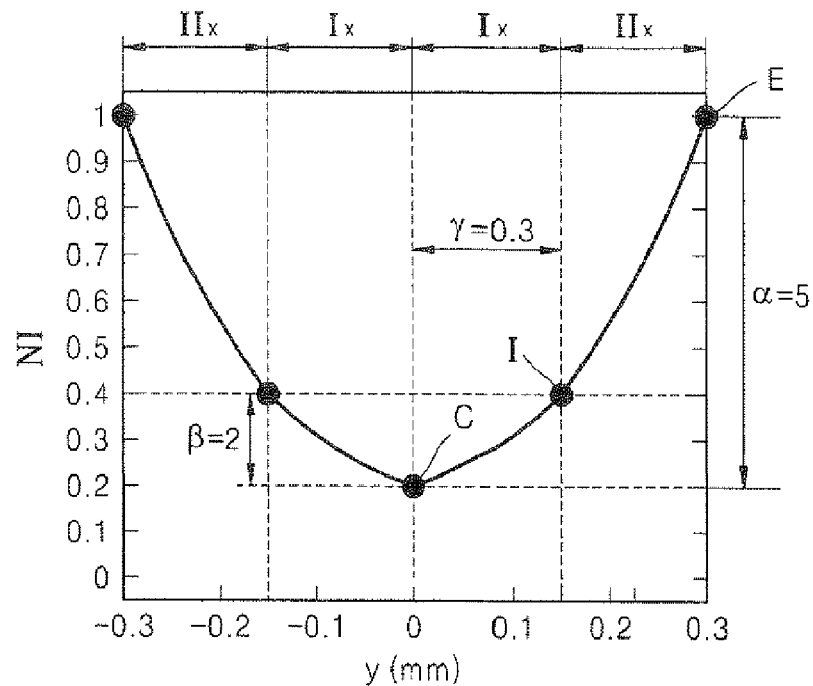
FIG. 19 is a cross-sectional view illustrating a surface (yz surface) of the beam profile of FIG. 18 which is perpendicular to a proceeding direction of a laser beam.
Figure 20:
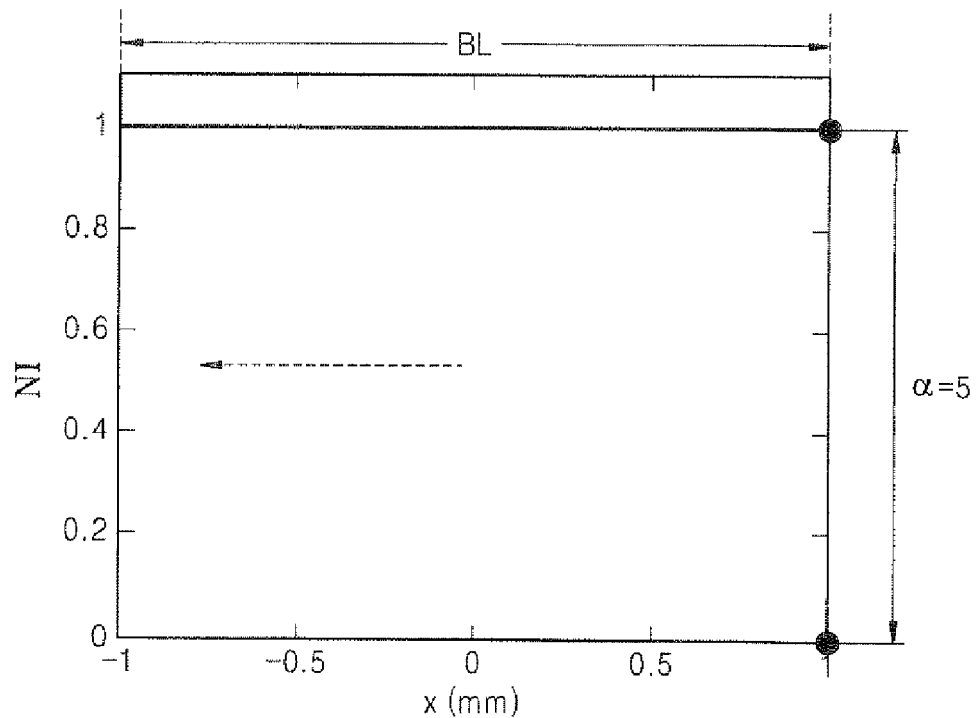
FIG. 20 is a cross-sectional view illustrating a surface (xz surface) of the beam profile of FIG. 18 which is perpendicular to a proceeding direction of a laser beam.
Figure 21:
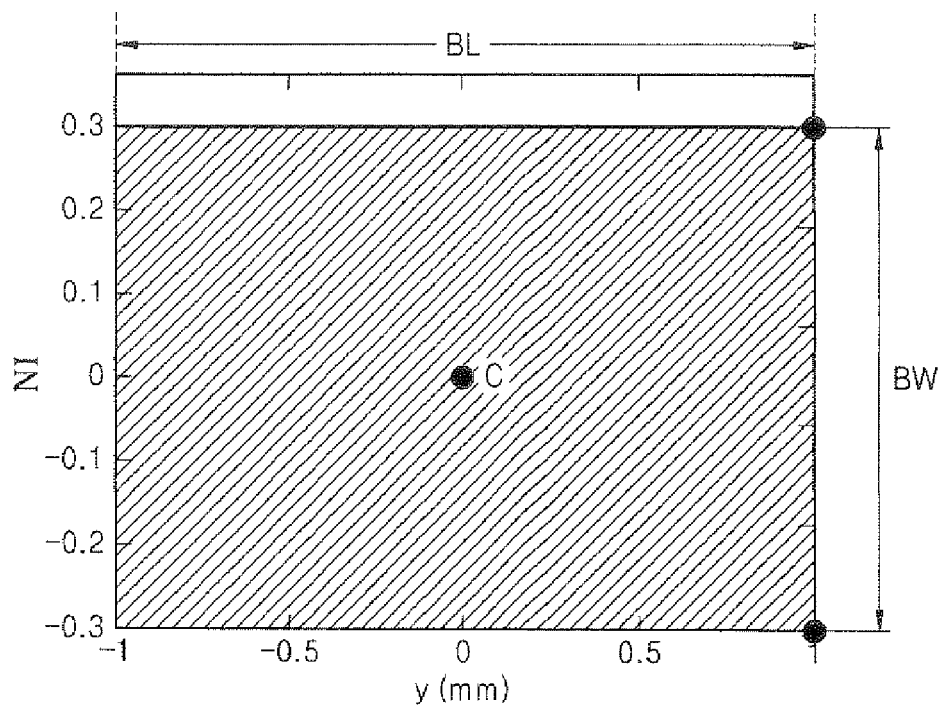
FIG. 21 is a top view of the beam profile of FIG. 18.

FIG. 18 is a schematic view illustrating a beam profile of a laser beam which is irradiated onto a frit of an organic light emitting display device in a laser beam irradiation apparatus according to another embodiment of the present invention, FIG. 19 is a cross-sectional view illustrating a surface (yz surface) of the beam profile of FIG. 18 which is perpendicular to a proceeding direction of a laser beam, FIG. 20 is a cross-sectional view illustrating a surface (xz surface) of the beam profile of FIG. 18 which is perpendicular to a proceeding direction of a laser beam, and FIG. 21 is a top view of the beam profile of FIG. 18.

A horizontal axis (x) and a vertical axis (y) denote positions of a beam profile regarding a frit width (FW), and a height (normalized intensity, NI) denotes normalization of beam intensity.

Referring to FIGS. 18 thru 21, a laser beam 260 irradiated from a laser beam irradiation apparatus 150 according to the current embodiment of the present invention onto frit 140 of an organic light emitting display device has a beam profile having a beam intensity which increases from a center portion (C) to an end portion (E) of a beam on a surface (yz surface) which is perpendicular to a laser beam proceeding direction. The beam intensity in the center portion (C) of the laser beam may preferably be half of the beam intensity of the end portion (E) of the laser beam or less.

The beam profile of the laser beam 260 according to the current embodiment of the present invention is symmetrical on the surface (yz surface) which is perpendicular to the laser beam proceeding direction (L), and the beam intensity increases toward the end portion (E) of the laser beam.

However, the beam intensity of the laser beam 260 according to the current embodiment of the present invention is uniform on a surface (xz surface) which is parallel to the laser beam proceeding direction. That is, while the laser beam 160 of the previous embodiment is symmetrical relative to the center portion of the laser beam, the laser beam 260 according to the current embodiment is symmetrical relative to the laser beam proceeding direction (L).

Referring to FIG. 19, the beam profile of the laser beam 260 according to the current embodiment includes a first section (Ix) in which a beam intensity slowly increases from a center portion (C) of the beam toward an end portion (E) of the beam, and a second section (IIx) in which an increase rate of the beam intensity of the first section (Ix) is greater than in the first section.

The profile of the laser beam 260 according to the current embodiment of the present invention includes an inflection point (I) which is determined at a boundary between the first section (Ix) and the second section (IIx), and is parallel and symmetrical to the laser beam proceeding direction (L). However, since the beam intensity is uniform on a surface (xz surface) which is parallel to the laser beam proceeding direction (L), the inflection point (I) does not exist on the surface (xz surface) which is parallel to the laser beam proceeding direction (L).

The inflection point (I) may be defined as parameters α, β, and γ, where α denotes a ratio of greatest beam intensity with respect to smallest beam intensity. According to the current embodiment, the smallest beam intensity is 0.1 in the center portion (C) of the beam, and the greatest beam intensity is 1.0 at an end portion (E) of the laser beam, and thus a becomes 5.

β denotes a ratio of beam intensity at an inflection point with respect to the smallest beam intensity. According to the current embodiment, the smallest beam intensity is 0.2 in the center portion (C) of the beam, and the beam intensity at the inflection point (I) is 0.4, and thus β becomes 2. γ denotes a ratio of horizontal distances between the center portion of the beam and the inflection point (I) with respect to the total beam width. According to the current embodiment, the total beam width is 0.6 mm, and a horizontal distance between the center portion of the laser beam and the inflection point (I) is 0.18 mm, and thus y becomes 0.3.

Referring to FIG. 10, which is a top view of the beam profile according to the current embodiment of the present invention, the laser beam 260 according to the current embodiment has a beam profile which is symmetrical relative to a laser beam proceeding direction (L). The laser beam 260 may be irradiated in the form of a rectangle which has a longer beam length (BL) than a beam width (BW). According to the current embodiment, the beam length (BL) is 2 mm, but may also be varied.

The laser beam 260 may be irradiated in the form of a rectangular line beam and be directly scanned along a sealing line of the sealing unit 140. Here, a center line of the laser beam 260 is focused on a center line of a sealing line, and then the laser beam 260 is scanned along the center line of the sealing line.

Accordingly, when irradiating the laser beam 160 having a beam profile, the intensity of which increases from the center portion (C) of the beam toward the end portion (E) of the beam to the sealing unit 140, a heat flux, which is an integration value of an intensity of a laser beam irradiated along the center line of the sealing line regarding time, is greater at the end portion of the sealing unit 140 than at the center portion of the sealing unit 140. Consequently, greater energy is supplied to the end portion of the sealing unit 140 than to the center portion of the sealing unit 140 and thus the temperature uniformity of a cross-section of the frit may be increased.

The sealing unit 140 may be formed of a frit.

A laser beam width (BW) may be designed to be substantially the same as a frit width (FW). According to the current embodiment, the laser beam width (BW) and the frit width (FW) are both 600 μm. However, the present invention is not limited thereto. Thus, the beam width (BW) of the laser beam 160 may be greater than the frit width (FW). However, when the beam width (BW) is too large, then, even when the laser beam 160 is blocked using a laser mask (not shown), energy transmitted to the laser mask is increased, and a wiring unit around the frit or an organic light emitting unit 130 may be damaged, and thus the beam width (BW) may preferably be twice the frit width (FW) or less.

Figure 22:
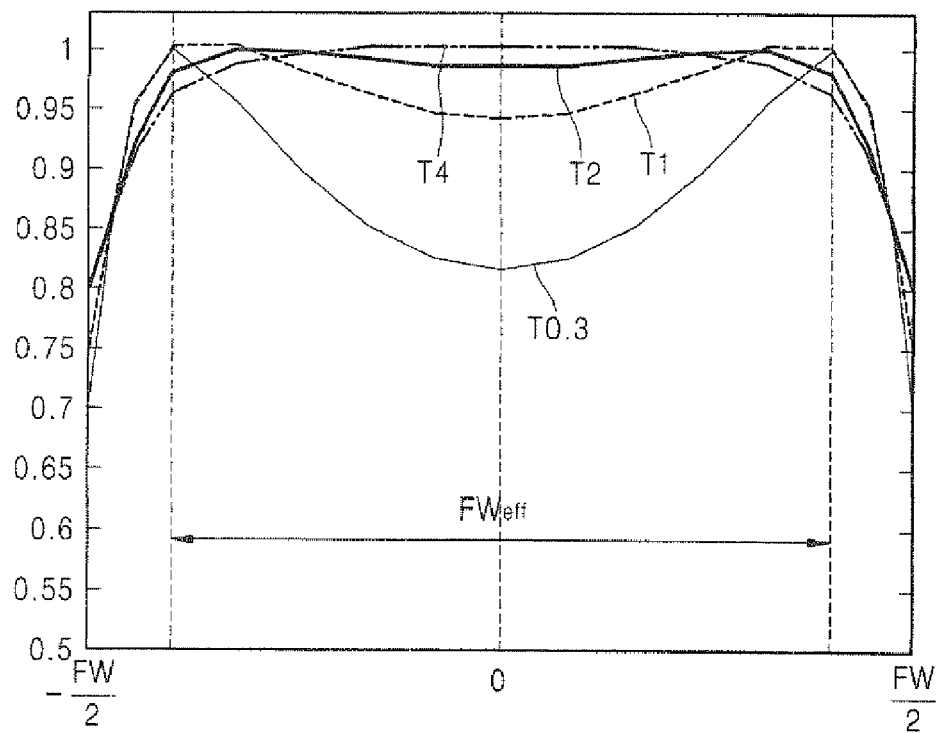
FIG. 22 is a graph showing the normalization of temperature distribution according to a cross-section of a frit when a laser beam having the beam profile of FIG. 18 is irradiated onto the frit, wherein a length of the laser beam is varied.

FIG. 22 is a graph showing the normalization of a temperature distribution along a cross-section of a frit when a laser beam having the beam profile of FIG. 18 is irradiated onto the frit while varying a beam length of the laser beam.

Referring to FIG. 22, in a temperature distribution (T_0.3 mm) with respect to a laser beam having a beam length of 0.3 mm, there is a temperature difference of 30% between a center portion and an end portion of the fit, and a temperature drop of about 19% is generated in the center portion of the frit.

In a temperature distribution (T_1 mm) with respect to a laser beam having a beam length of 1 mm, there is a temperature difference of 25% between a center portion and an end portion of the frit, and there is a temperature drop of about 6% in the center portion of the frit.

In a temperature distribution (T_2 mm) regarding a laser beam having a beam length of 2 mm, there is a temperature difference of 20% between a center portion and an end portion of the frit, and there is a temperature difference of less than 3% between the center portion and the end portion of the frit.

In a temperature distribution (T_4) regarding a laser beam having a beam length of 4 mm, there is a temperature difference of 2% between a center portion and an end portion of the frit, and within an effective sealing width (FWeff), there is a temperature difference of less than 2% between the center portion and the end portion of the fit.

Regarding the Gaussian beam profiles of FIGS. 3 and 4, there is a temperature difference of 45% or greater between the center portion and the end portion of the frit, and within an effective sealing width (FWeff), there is a maximum temperature difference of 34% between the center portion and the end portion of the fit. Also, when a laser beam having the beam profiles according to the current embodiment and modified examples is irradiated, the uniformity in the temperature distribution along the end portion of the frit is improved.

Figure 23:
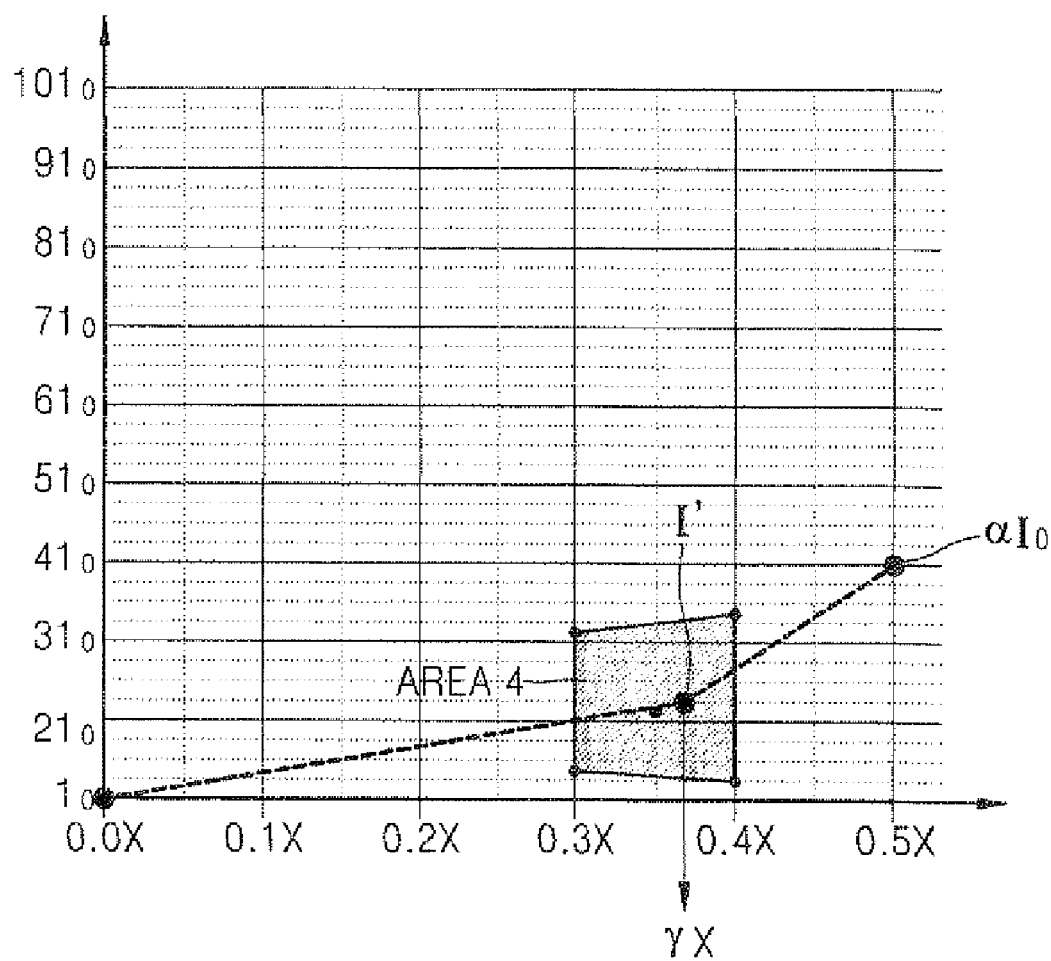
FIG. 23 illustrates an area in which an inflection point may exist for maintaining a temperature difference between a center portion and an end portion of a frit so as to be less than 15% within an effective sealing width (FWeff)

FIG. 23 illustrates an area in which an inflection point may exist for maintaining a temperature difference between a center portion and an end portion of a frit so as to be less than 15% within an effective sealing width Fweff.

FIG. 23 illustrates an area AREA4 where an inflection point (I') of a laser beam may exist when the laser beam having a parameter α of 4 is irradiated onto the fit. By selecting a point within the area AREA4, appropriate β and γ may be determined.

Although not shown in FIG. 23, when the scanning speed of the laser beam is increased while other conditions are the same, the area AREA4 for selecting an inflection point is increased. However, when the beam scanning speed is 5 mm/sec or less, the frit may be sealed using an appropriate laser power but the processing efficiency is decreased due to an increased tag time. On the other hand, when the beam scanning speed is 50 mm/sec or greater, an accumulative heat flux of the beam intensity increases with time, thereby increasing the temperature of the frit. Considering this, the scanning speed of the beam may preferably be higher than 5 mm/sec and lower than 50 mm/sec.

Embodiment 3

Figure 24:
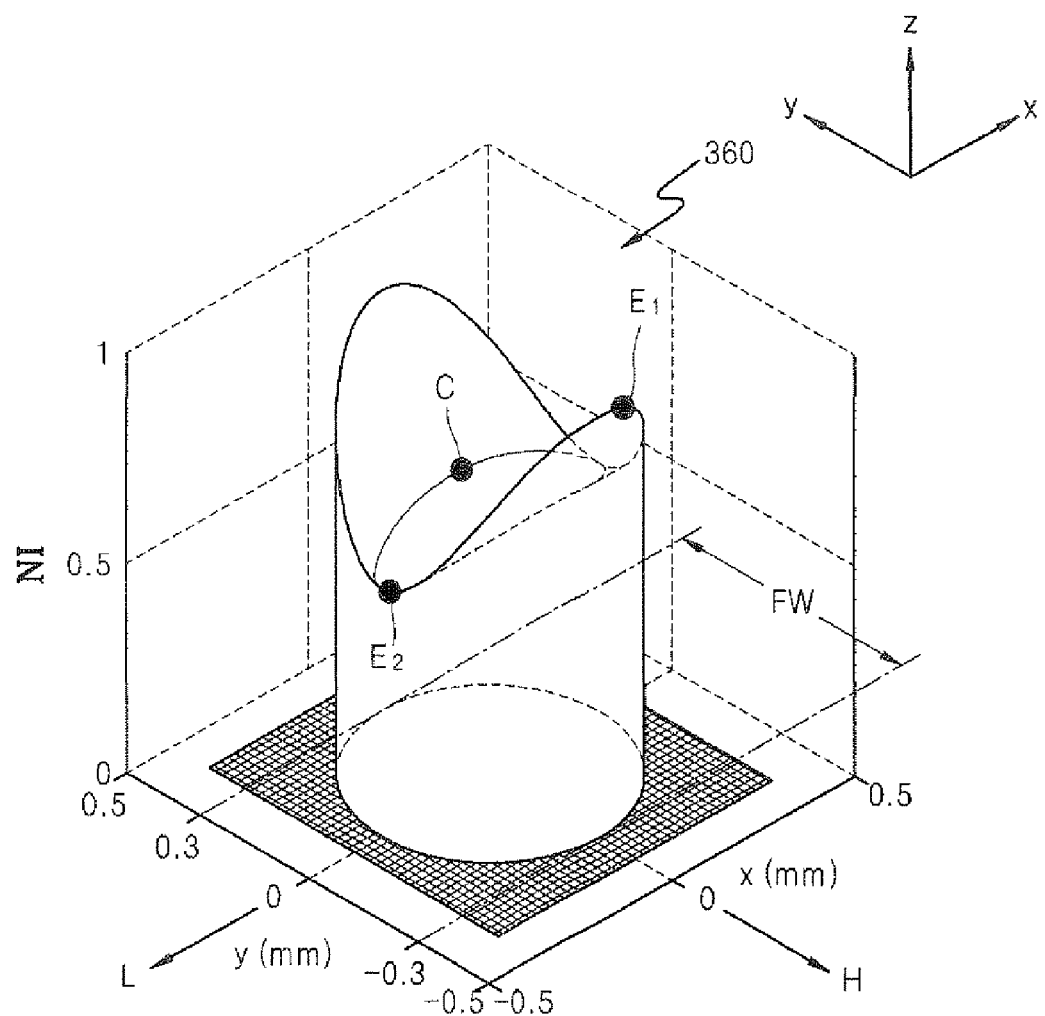
FIG. 24 is a schematic view illustrating a beam profile of a laser beam which is irradiated onto a frit of an organic light emitting display device in a laser beam irradiation apparatus according to another embodiment of the present invention.
Figure 25:
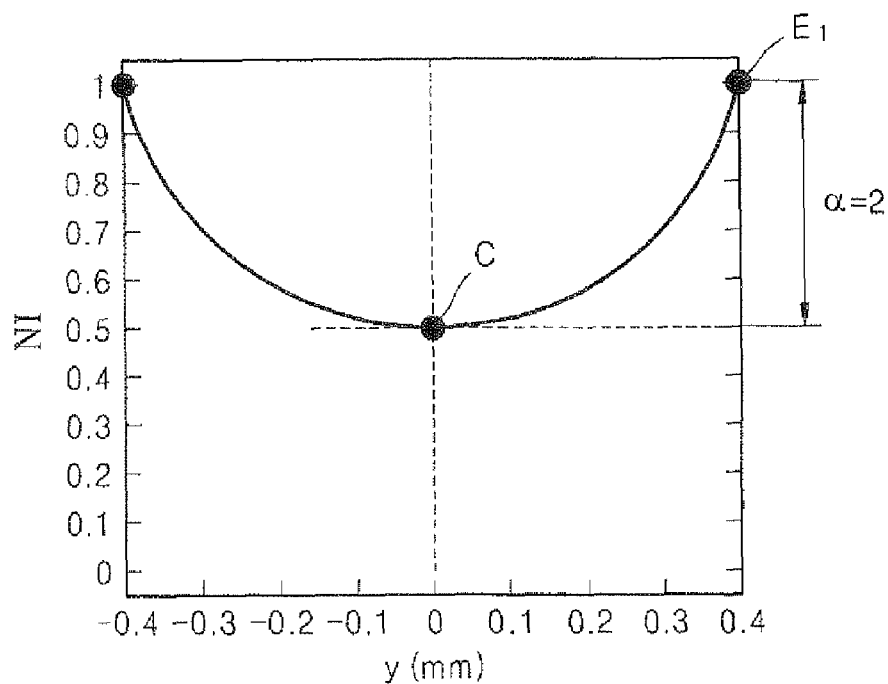
FIG. 25 is a cross-sectional view of a surface (yz surface) of the beam profile of FIG. 24 which is perpendicular to a proceeding direction of the laser beam.
Figure 26:
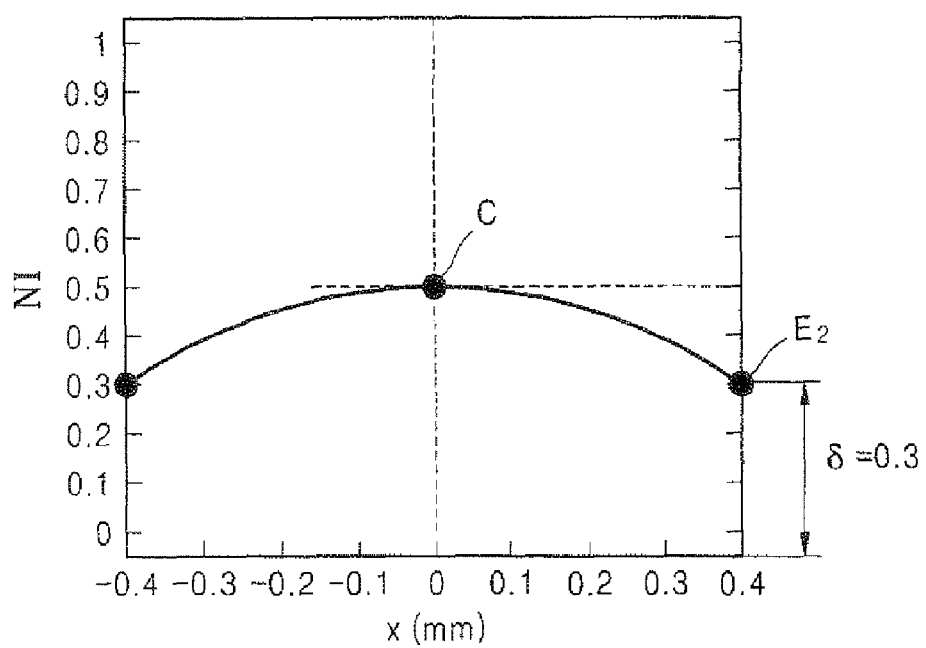
FIG. 26 is a cross-sectional view of a surface (xz surface) of the beam profile of FIG. 24 which is parallel to a proceeding direction of the laser beam.
Figure 27:
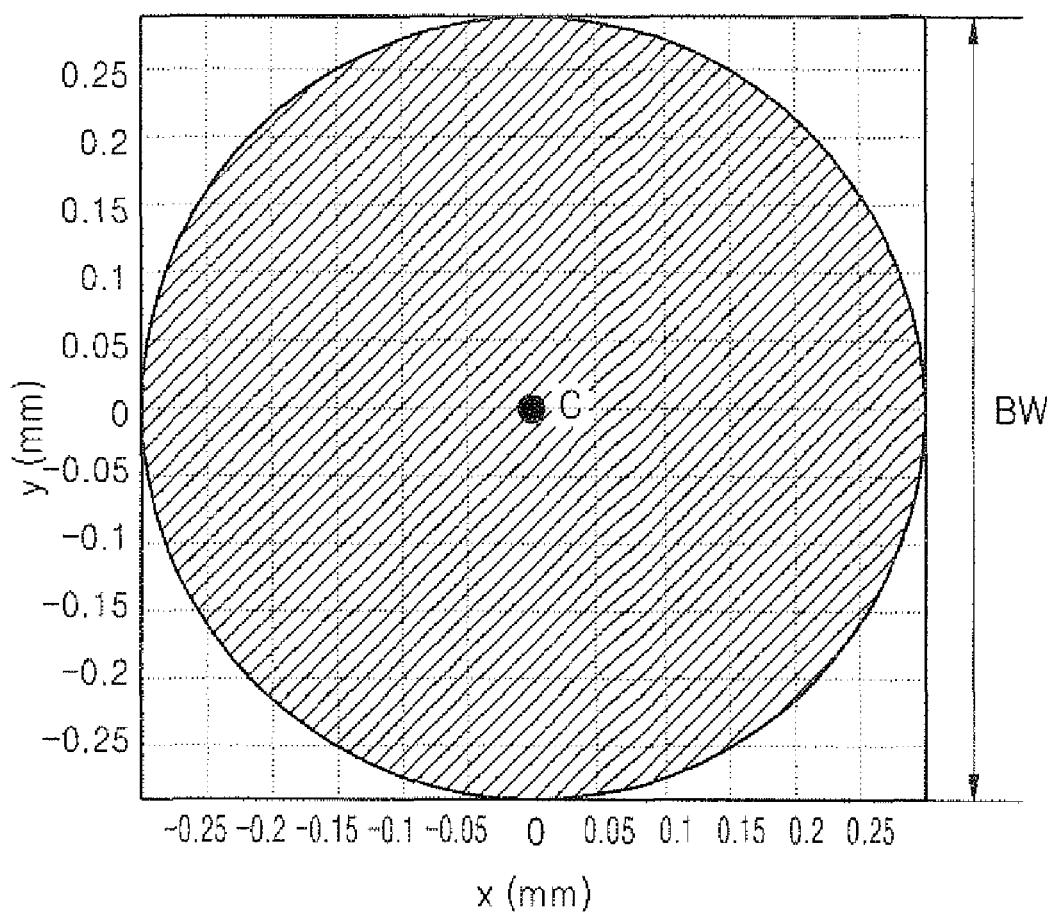
FIG. 27 is a top view illustrating the beam profile of FIG. 24.

FIG. 24 is a schematic view illustrating a beam profile of a laser beam which is irradiated onto a frit of an organic light emitting display device in a laser beam irradiation apparatus according to another embodiment of the present invention, FIG. 25 is a cross-sectional view of a surface (yz surface) of the beam profile of FIG. 24 which is perpendicular to a proceeding direction of the laser beam, FIG. 26 is a cross-sectional view of a surface (xz surface) of the beam profile of FIG. 24 which is parallel to a proceeding direction of the laser beam, and FIG. 27 is a top view illustrating the beam profile of FIG. 24.

A horizontal axis (x) and a vertical axis (y) denote positions of a beam profile with respect to a frit width (FW), and a height (normalized intensity, NI) is a normalized value of beam intensity.

Referring to FIGS. 24 thru 27, a laser beam 360 irradiated onto frit 140 of an organic light emitting display device from a laser beam irradiation apparatus 150 according to the current embodiment of the present invention has a profile, the beam intensity of which increases from a center portion (C) to an end portion (E1) of the beam on a surface (yz surface) which is perpendicular to a laser beam proceeding direction. The beam intensity at the center portion (C) of the beam may preferably be half of the beam intensity at the end portion (E1) of the beam or less.

However, the laser beam 360 according to the current embodiment of the present invention has a different beam intensity increase rate on the surface (xz surface) which is parallel to the laser beam proceeding direction from on the surface (yz surface) which is perpendicular to the laser beam proceeding direction.

Referring to FIG. 26, the laser beam 360 according to the current embodiment of the present invention has a profile whose beam intensity is reduced from the center portion (C) to an end portion (E2) of the beam on the surface (xz surface) which is parallel to the laser beam proceeding direction of the laser beam.

The laser beam 360 has different beam intensity increase rates on the surface (xz surface) which is parallel to the laser beam proceeding direction, and on the surface (yz surface) which is perpendicular to the laser beam proceeding direction, but has symmetrical beam profiles with respect to the center portion (C) of the laser beam.

The laser beam 360 may be defined by parameters α and δ, where α denotes a ratio of greatest beam intensity with respect to smallest beam intensity on the surface (yz surface) which is perpendicular to the laser beam proceeding direction. Referring to FIG. 25, the smallest beam intensity on the surface (yz surface) which is perpendicular to the laser beam proceeding direction is 0.5 at the center portion (C) of the laser beam, and the greatest beam intensity at the end portion (E1) of the laser beam is 1.0, and thus a becomes 2.

δ denotes a beam intensity at the end portion of the laser beam on the surface (xz surface) which is parallel to the laser beam proceeding direction. Referring to FIG. 27, the beam intensity at the end portion (E2) of the beam is 0.3 on the surface (xz surface) which is parallel to the laser beam proceeding direction, and thus δ is 0.3.

Referring to FIG. 27 illustrating a top view of the beam profile according to the current embodiment, the laser beam 360 has a beam profile which is symmetrical relative to a laser beam proceeding direction (L) and a direction (H) which is perpendicular to the laser beam proceeding direction, and thus a beam width (BW) is also symmetrical relative to the laser beam proceeding direction (L) and the direction (H) which is perpendicular to the laser beam proceeding direction, and thus the laser beam 360 may be irradiated in the form of a circular spot.

The laser beam 360 may be irradiated in the form of a rectangular line beam and directly scanned along a sealing line of the sealing unit 140. In this regard, a center line of the laser beam 360 is focused on a center line of a sealing line, and then the laser beam 360 is scanned along the center line of the sealing line.

Accordingly, when irradiating the laser beam 160 which has a beam profile, the beam intensity of which increases from the center portion (C) of the beam toward the end portion (E) of the beam, to the sealing unit 140, a heat flux, which is an integration value of the intensity of a laser beam irradiated along the center line of the sealing line over time, is greater at the end portion of the sealing unit 140 than at the center portion of the sealing unit 140. Consequently, greater energy is supplied to the end portion of the sealing unit 140 than to the center portion of the sealing unit 140, and thus the temperature uniformity of a cross-section of the frit may be increased.

The sealing unit 140 may be formed of a frit.

A laser beam width (BW) may be designed to be substantially the same as a frit width (FW). According to the current embodiment, the laser beam width (BW) and the frit width (FW) are both 600 μm. However, the present invention is not limited thereto. Thus, the beam width (BW) of the laser beam 160 may be greater than the frit width (FW). However, when the beam width (BW) is too large, then, even when the laser beam 160 is blocked using a laser mask (not shown), energy transmitted to the laser mask is increased, and a wiring unit around the frit or an organic light emitting unit 130 may be damaged, and thus the beam width (BW) may preferably be twice the frit width (FW) or less.

Figure 28:
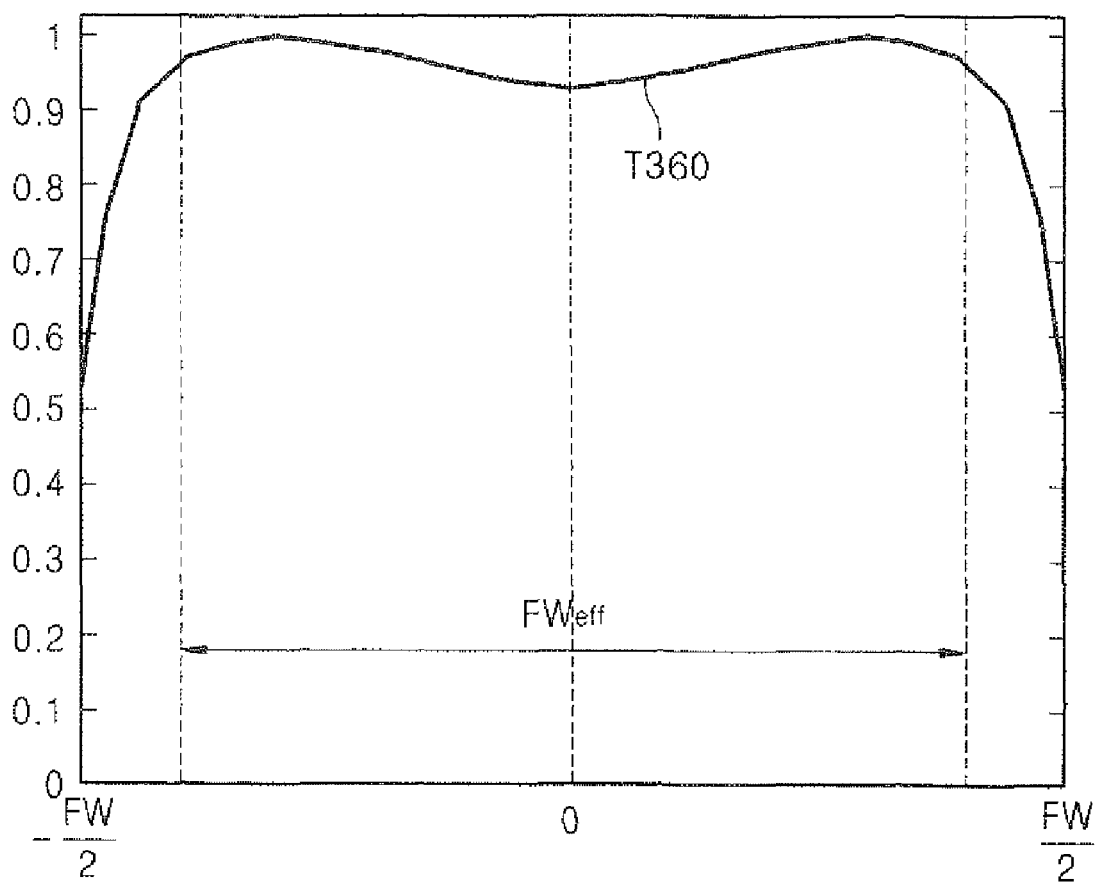
FIG. 28 is a graph showing the normalization of temperature distribution according to a cross-section of a frit when a laser beam having the beam profile of FIG. 24 is irradiated onto the frit.

FIG. 28 is a graph showing the normalization of temperature distribution according to a cross-section of a frit when a laser beam having the beam profile of FIG. 24 is irradiated onto the frit.

Referring to FIG. 28, there is a temperature difference of 40% between a center portion and an end portion of the frit in the temperature distribution T360 with respect to the laser beam 360 having the beam profile of FIG. 24. However, within an effective sealing width (FWeff), there is a temperature difference of less than 9% between the center portion and the end portion of the frit.

Regarding the Gaussian beam profiles of FIGS. 3 and 4, there is a temperature difference of 45% or greater between the center portion and the end portion of the frit, and within an effective sealing width (FWeff), there is a maximum temperature difference of 34% between the center portion and the end portion of the frit. Also, when a laser beam having the beam profiles according to the current embodiment and modified examples is irradiated, the uniformity in the temperature distribution along the end portion of the frit is improved.

Figure 29:
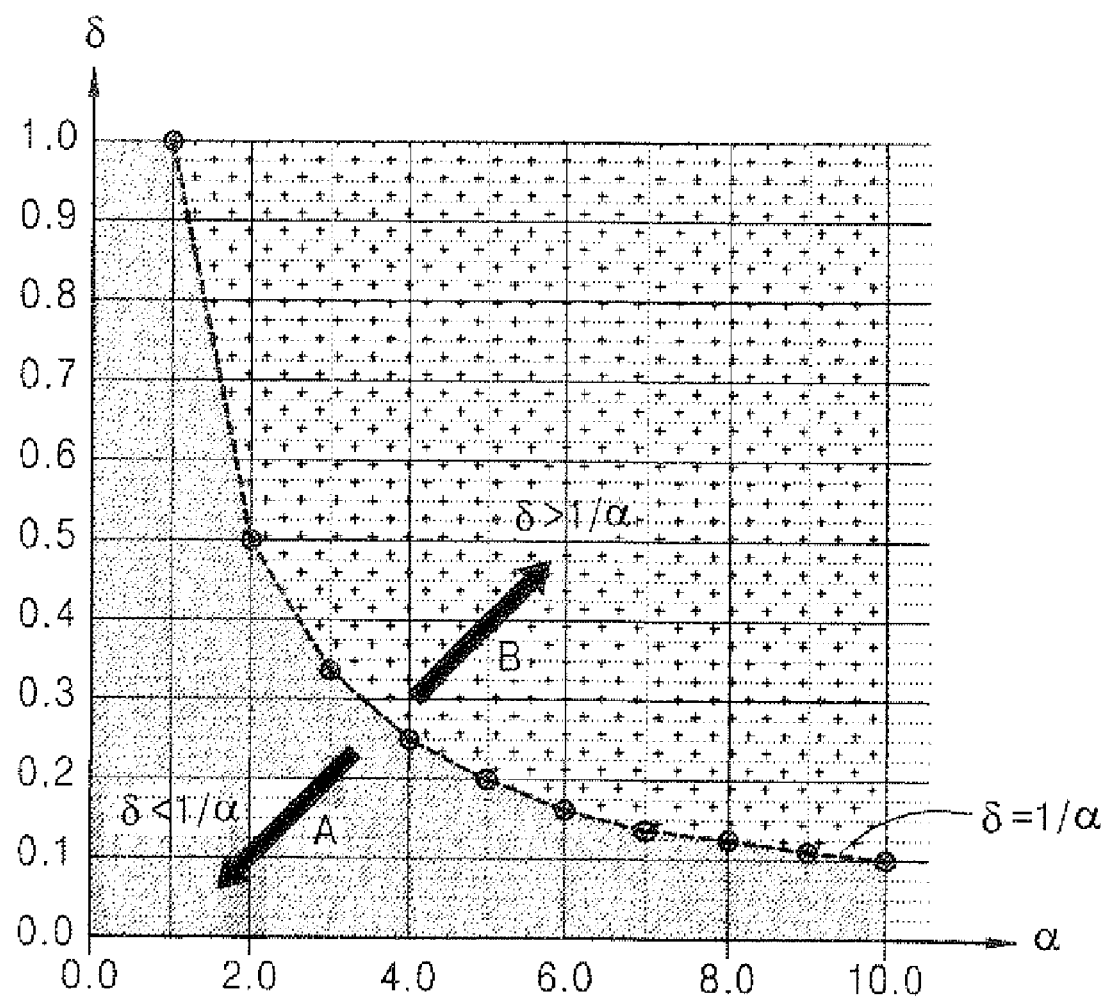
FIG. 29 is a graph showing areas where the shape of the beam profile varies according to a relationship between a and $1/\delta$.

FIG. 29 is a graph showing areas where the shape of the beam profile varies according to a relationship between $\alpha$ and $1/\delta$.

Referring to FIG. 29, with respect to a line of $\delta=1/\alpha$, a lower left area (A) satisfies an inequality of $\delta<1/\alpha$, and an upper right area (B) satisfies an inequality of $\delta>1/\alpha$.

Figure 30:
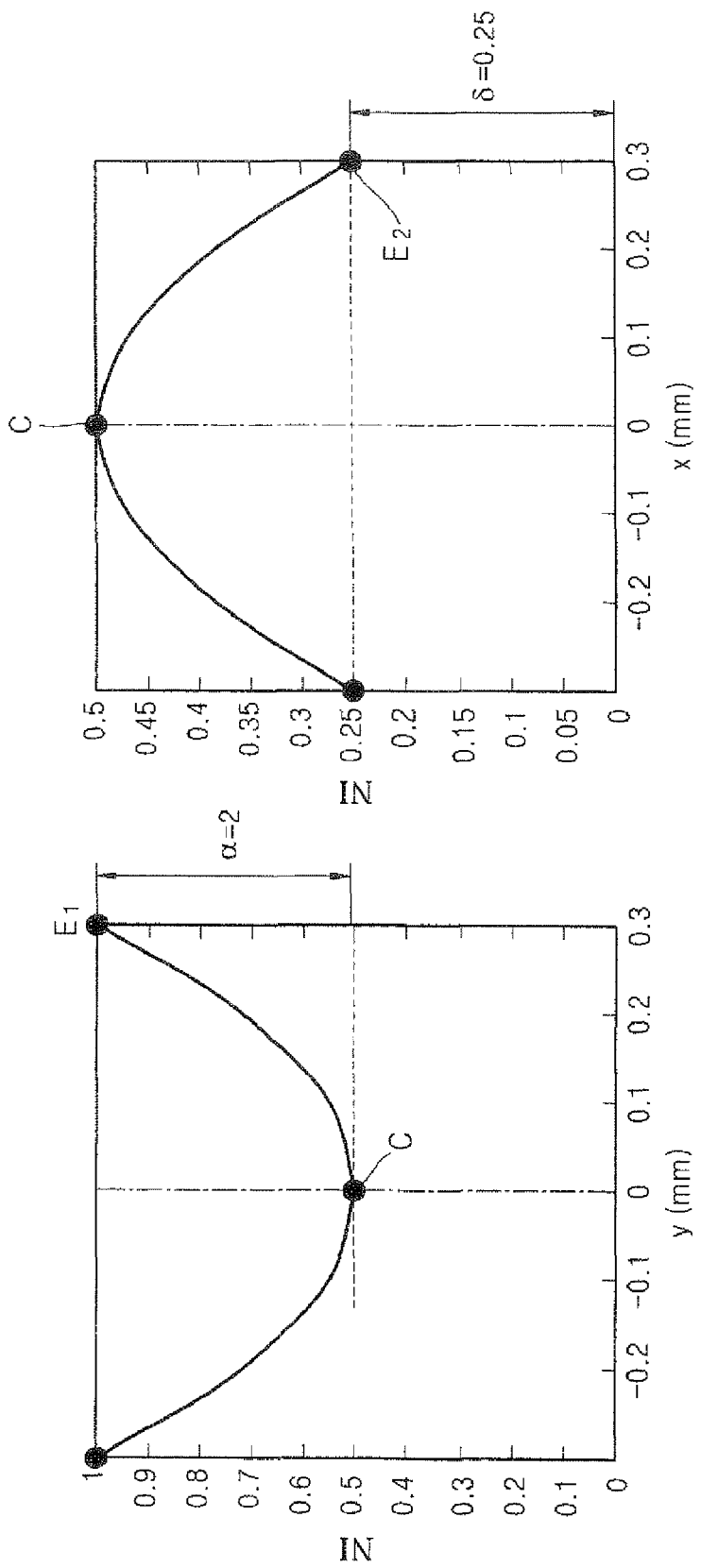
FIG. 30 is a graph illustrating an example satisfying an inequality of $\delta < 1/\alpha$.
Figure 31:
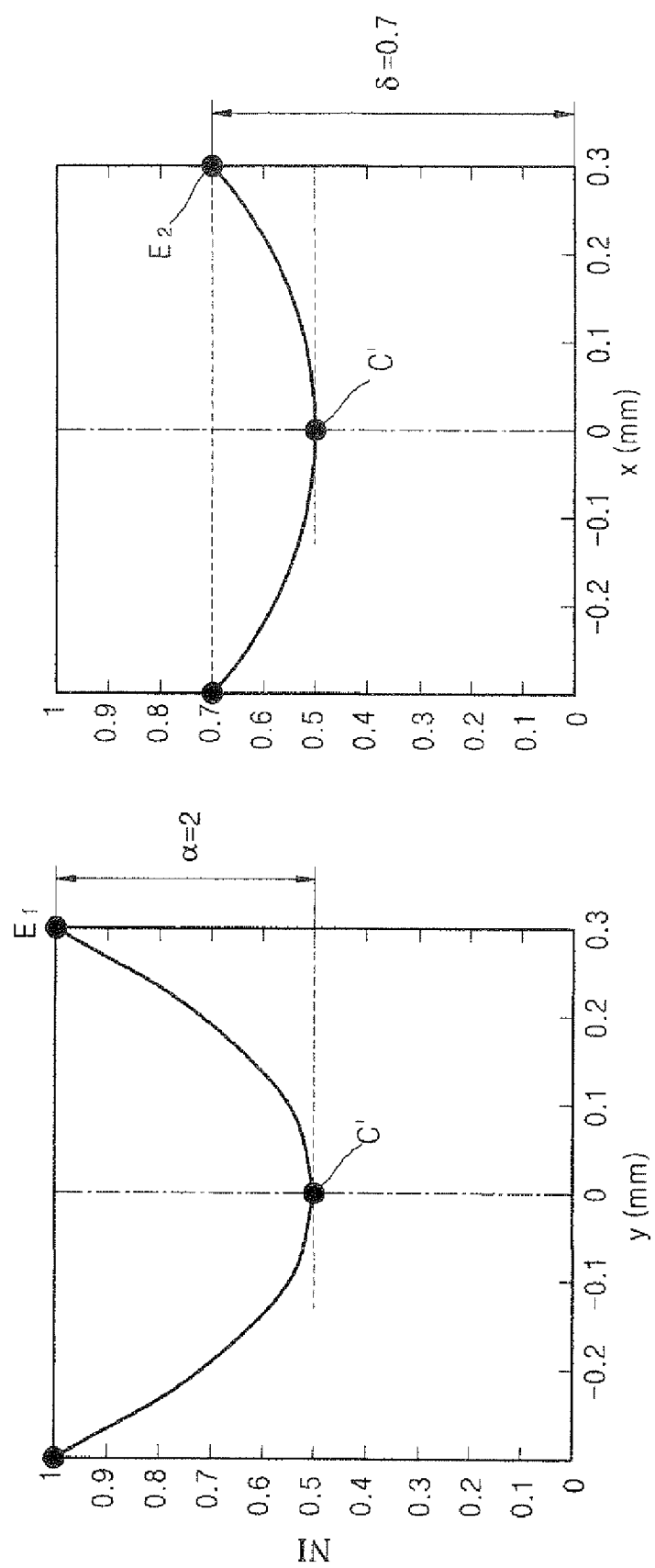
FIG. 31 is a graph illustrating an example satisfying an inequality of $\delta > 1/\alpha$.

FIG. 30 is a graph illustrating an example satisfying the inequality of $\delta<1/\alpha$, and FIG. 31 is a graph illustrating an example satisfying the inequality of $\delta>1/\alpha$.

Referring to FIG. 30, $\alpha=2$ and $\delta=0.25$, and thus the inequality $\delta<1/\alpha$ is satisfied. The laser beam 360 illustrated in FIGS. 24 thru 27 satisfies the inequality of $\delta<1/\alpha$.

As described above, the laser beam which satisfies the inequality of $\delta<1/\alpha$ has a beam profile having a beam intensity which increases from the center portion (C) to the end portion (E1) of the beam on the surface (yz surface) which is perpendicular to the laser beam proceeding direction, and a beam profile having a beam intensity which decreases from the center portion (C) to the end portion (E1) of the beam on the surface (xz surface) which is parallel to the laser beam proceeding direction.

Referring to FIG. 31, $\alpha=2$ and $\delta=0.75$, and thus the inequality $\delta>1/\alpha$ is satisfied. A laser beam which satisfies the inequality of $\delta>1/\alpha$ has a beam profile having a beam intensity which increases from a center portion (C') of the beam to an end portion (E1') of the beam, and a beam profile having a beam intensity which increases from a center portion (C') of the beam to an end portion (E2') of the beam on the surface (xz surface) which is parallel to the laser beam proceeding direction.

That is, like the laser beam 360 illustrated in FIGS. 24 thru 27 described above, the beam intensity increase rates of the laser beam according to the current embodiment of the present invention are different on the surface (xz surface) which is parallel to the laser beam proceeding direction and on the surface (yz surface) which is perpendicular to the laser beam proceeding direction, and the beam intensity increases from the center portion (C') to the end portion (E1') of the laser beam on the surface (yz surface) which is perpendicular to the laser beam proceeding direction, and is similar to the laser beam 360 with regard to the beam profile which is symmetrical relative to the center portion (C') of the laser beam.

However, the laser beam 360 illustrated in FIGS. 24 thru 27 described above has a beam profile having a beam intensity which decreases from the center portion (C) to the end portion (E2) of the beam on the surface (xz surface) which is parallel to the laser beam proceeding direction. On the other hand, when the inequality of $\delta>1/\alpha$ is satisfied, the laser beam has a beam profile having a beam intensity which increases from the center portion (C') to the end portion (E2') of the beam on the surface (xz surface) which is parallel to the laser beam proceeding direction.

Figure 32:
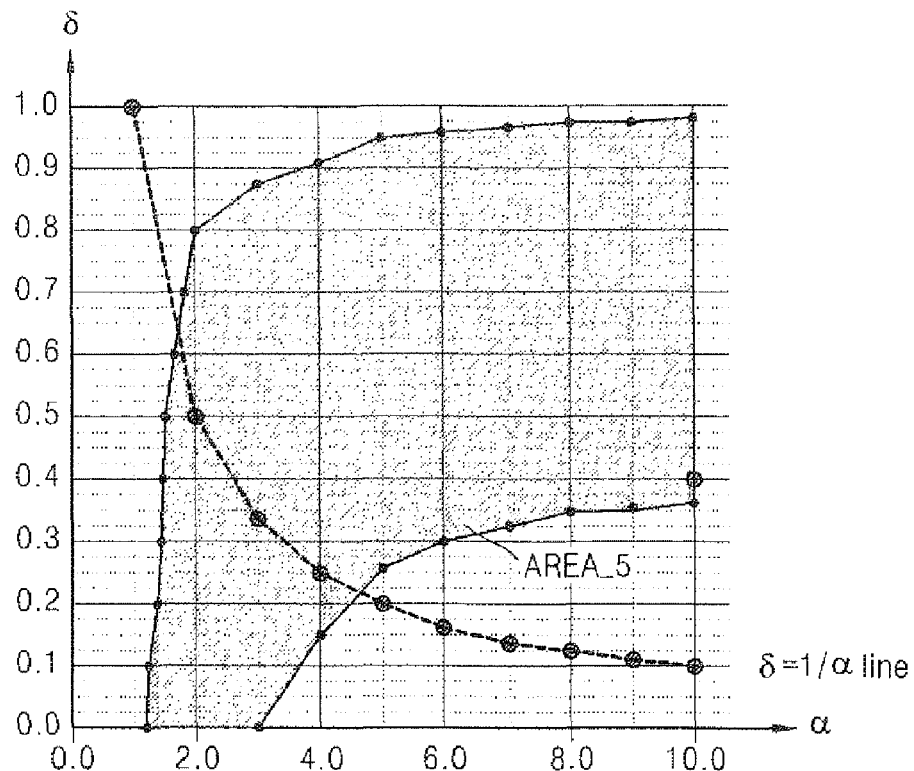
FIGS. 32 thru 34 illustrate areas of an inflection point for maintaining a temperature difference between a center portion and an end portion of a frit so as to be less than 15% within effective sealing widths of a laser beam which satisfies an inequality of $\delta < 1/\alpha$ and a laser beam which satisfies an inequality of $\delta > 1/\alpha$ according to various scanning speeds of the laser beam.
Figure 33:
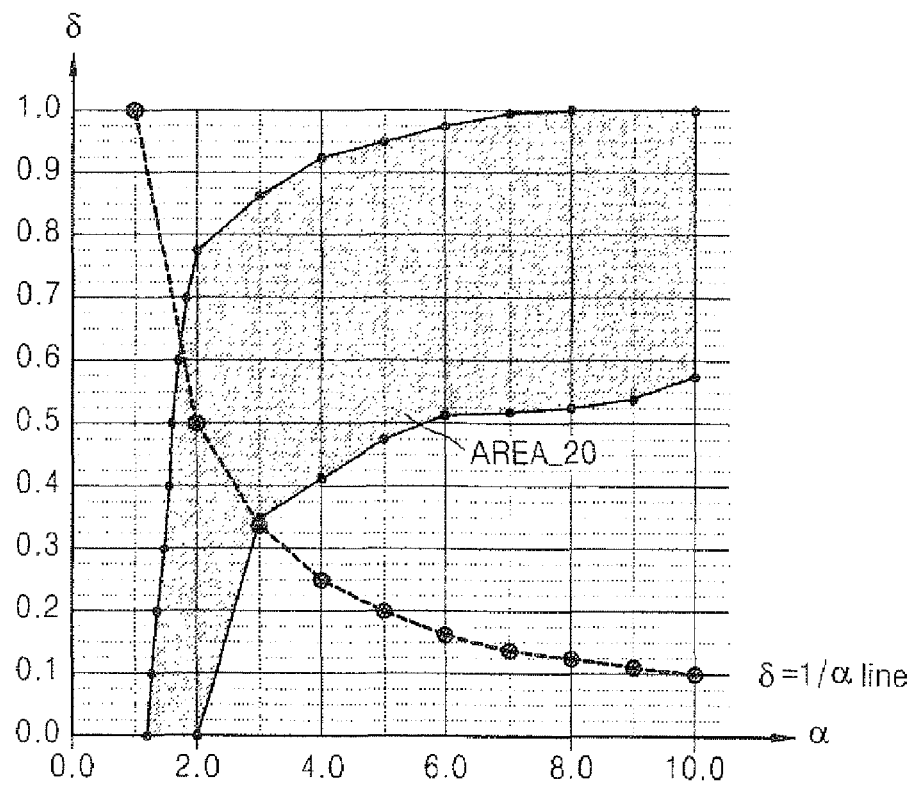
Figure 34:
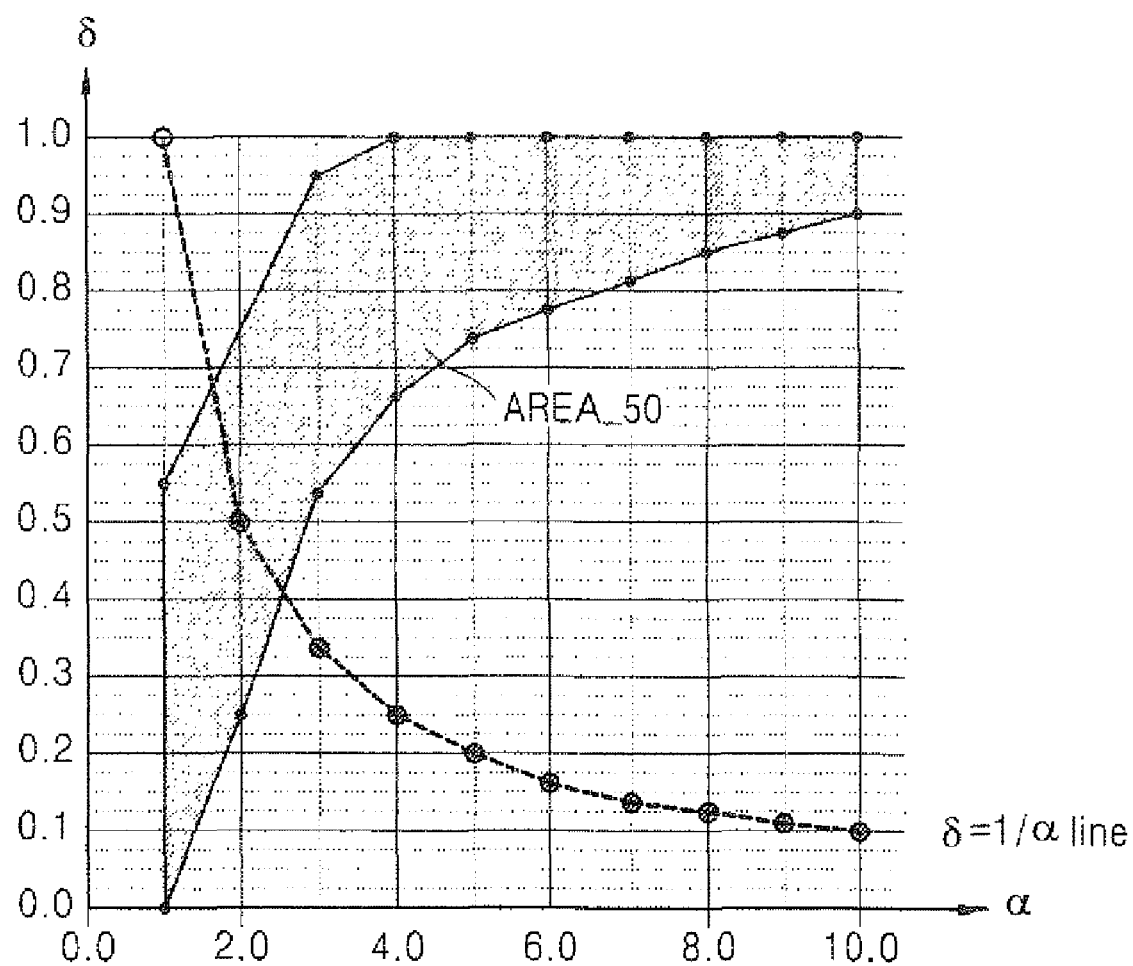

FIGS. 32 thru 34 illustrate areas of an inflection point for maintaining a temperature difference between a center portion and an end portion of a frit so as to be less than 15% within effective sealing widths of a laser beam that satisfies a relationship of $\delta<1/\alpha$ and a laser beam which satisfies a relationship of $\delta<1/\alpha$ according to various scanning speeds of the laser beam.

FIG. 32 illustrates an area AREA_5 where an inflection point of a laser beam may exist for maintaining a temperature difference of less than 15% between a center portion and an end portion of a frit within an effective sealing width when a laser beam is irradiated onto the frit at a scanning speed of 5 mm/sec.

FIG. 33 illustrates an area AREA_20 where an inflection point of a laser beam may exist for maintaining a temperature difference of less than 15% between a center portion and an end portion of a frit within an effective sealing width when a laser beam is irradiated onto the frit at a scanning speed of 20 mm/sec.

FIG. 34 illustrates an area AREA_50 where an inflection point of a laser beam may exist for maintaining a temperature difference of less than 15% between a center portion and an end portion of a frit within an effective sealing width when a laser beam is irradiated onto the frit at a scanning speed of 50 mm/sec.

Referring to FIGS. 32 thru 34, both the laser beam which satisfies the inequality of $\delta<1/\alpha$ and the laser beam which satisfies the inequality of $\delta>1/\alpha$ have an area in which an inflection point of the laser beam may exist, which may maintain a temperature difference between a center portion and an end portion of the frit within an effective sealing width to be less than 15% and which increases as the scanning speed is reduced. Accordingly, a selection width for $\alpha$ and $\delta$ increases as the area for the inflection point increases, and thus the freedom degree of selecting a parameter of the laser beam for improving the temperature uniformity of the end portion of the frit is also increased.

However, when the beam scanning speed is less than 5 mm/sec, the process efficiency is decreased due to the increased tag time, and when the beam scanning speed is over 50 mm/sec, an accumulative heat flux of the beam intensity with time is increased, thereby increasing the temperature of the frit. Considering this, the beam scanning speed may preferably be higher than 5 mm/sec and lower than 50 mm/sec.

The sealing unit 140 according to embodiments of the present invention is formed using a frit, but is not limited thereto. The sealing unit 140 may also be formed using various other materials, which are obvious to one of ordinary skill in the art.

Furthermore, the method of sealing an organic light emitting display device by using a laser beam irradiation apparatus has been described with reference to embodiments of the present invention, but is not limited thereto. That is, as long as a sealing pattern, such as a frit, is included between two substrates and the substrates are sealed by irradiating a laser beam onto the sealing pattern, the method may be used in various devices regardless of the type of display devices.

By irradiating a laser beam, including a beam profile according to an embodiment of the present invention, onto a sealing unit of an organic light emitting display device, temperature distribution uniformity of an end portion of the sealing unit may be improved, thereby improving adhesive force of the sealing unit of the organic light emitting display device.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A laser beam irradiation apparatus which irradiates a laser beam onto a sealing unit disposed between a first substrate and a second substrate so as to seal the first substrate and the second substrate, wherein the laser beam has a beam intensity which increases from a center portion to an end portion of the laser beam on a surface which is perpendicular to a proceeding direction of the laser beam, and the beam intensity at the center portion of the laser beam is no greater than half of the beam intensity at the end portion of the laser beam, and the laser beam has a beam profile which is symmetrical relative to the proceeding direction of the laser beam.

2. The laser beam irradiation apparatus of claim 1, wherein the laser beam sequentially includes a first section in which a beam intensity slowly increases from a center portion to an end portion of the laser beam and a second section having a greater beam intensity increase rate than the first section.

3. The laser beam irradiation apparatus of claim 2, wherein the laser beam is symmetrical relative to a surface which is parallel to a proceeding direction of the laser beam.

4. The laser beam irradiation apparatus of claim 3, wherein an inflection point on a boundary between the first section and the second section is symmetrically distributed with respect to the center portion of the laser beam.

5. The laser beam irradiation apparatus of claim 3, wherein the laser beam further includes a third section in which a beam intensity rapidly decreases, the third section being disposed on an outer portion of the second section.

6. The laser beam irradiation apparatus of claim 3, wherein the laser beam further includes a third section in which a beam intensity is uniform, the third section being disposed on an outer portion of the second section.

7. The laser beam irradiation apparatus of claim 3, wherein the laser beam is irradiated in the form of a spot beam.

8. The laser beam irradiation apparatus of claim 2, wherein the laser beam has a uniform beam intensity on a surface which is parallel to the proceeding direction of the laser beam.

9. The laser beam irradiation apparatus of claim 8, wherein an inflection point, which is at a boundary between the first section and the second section, is symmetrical with respect to the surface which is perpendicular to the proceeding direction of the laser beam.

10. The laser beam irradiation apparatus of claim 8, wherein an inflection point which is at a boundary between the first section and the second section does not exist on the surface which is parallel to the proceeding direction of the laser beam.

11. The laser beam irradiation apparatus of claim 8, wherein a cross-section of the laser beam is rectangular.

12. The laser beam irradiation apparatus of claim 1, wherein the laser beam on a surface which is parallel to the proceeding direction of the laser beam has a different beam intensity increase rate compared to a beam intensity increase rate of a beam profile on the surface which is perpendicular to the proceeding direction of the laser beam, and has a beam profile which is symmetrical relative to a center of the laser beam overall.

13. The laser beam irradiation apparatus of claim 12, wherein a beam profile on the surface which is parallel to the proceeding direction of the laser beam has a beam intensity which decreases from the center portion to the end portion of the laser beam.

14. The laser beam irradiation apparatus of claim 12, wherein a beam profile on the surface which is parallel to the proceeding direction of the laser beam has a beam intensity which increases from the center portion to the end portion of the laser beam.

15. The laser beam irradiation apparatus of claim 12, wherein the laser beam is irradiated in the form of a spot beam.

16. A method of sealing a substrate by irradiating a laser beam onto a sealing unit disposed between a first substrate and a second substrate, the method comprising the steps of:
    forming a sealing unit between the first substrate and the second substrate;
    irradiating a laser beam onto the sealing unit, wherein a beam intensity of the laser beam increases from a center portion of the laser beam to an end portion of the laser beam on a surface which is perpendicular to a proceeding direction of the laser beam, and a beam intensity in the center portion of the laser beam is no greater than half of a beam intensity at the end portion of the laser beam, and the laser beam has a beam profile which is symmetrical relative to the proceeding direction of the laser beam; and
    irradiating the laser beam along a sealing line of the sealing unit.

17. The method of claim 16, wherein a center portion of the laser beam is focused on a center line of the sealing line, and the laser beam is scanned along the center line of the sealing line so as to irradiate the laser beam.

18. The method of claim 16, wherein a beam width (BW) of the laser beam is greater than a width of the sealing unit.

19. The method of claim 18, wherein the beam width (BW) of the laser beam is 4/3 to 2 times the width of the sealing unit.

20. The method of claim 16, wherein a beam width (BW) of the laser beam is substantially the same as a width of the sealing unit.

21. The method of claim 16, wherein a heat flux, which is an integration value of the beam intensity of the laser beam which is scanned and irradiated along a center line of the sealing line, with respect to time, is greater at an end portion of the sealing unit than at a center portion of the sealing unit.

22. The method of claim 16, wherein the sealing unit comprises a frit.

23. The method of claim 16, wherein the laser beam sequentially includes a first section in which a beam intensity slowly increases from a center portion to an end portion of the laser beam, and a second section having a greater beam intensity increase rate than the first section.

24. The method of claim 23, wherein the laser beam is symmetrical relative to a surface which is parallel to a proceeding direction of the laser beam.

25. The method of claim 24, wherein an inflection point at a boundary between the first section and the second section is symmetrically distributed with respect to the center portion of the laser beam.

26. The method of claim 24, wherein the laser beam further includes a third section which is disposed on an outer portion of the second section, wherein a beam intensity rapidly decreases in the third section.

27. The method of claim 24, wherein the laser beam further comprises a third section which is disposed on an outer portion of the second section, wherein a beam intensity is uniform in the third section.

28. The method of claim 24, wherein the laser beam is irradiated onto the sealing unit in the form of a spot beam along the sealing line.

29. The method of claim 23, wherein the laser beam has a uniform beam intensity on a surface that is parallel to the proceeding direction of the laser beam.

30. The method of claim 29, wherein an inflection point, which is at a boundary between the first section and the second section, is distributed symmetrically relative to the surface that is perpendicular to the proceeding direction of the laser beam.

31. The method of claim 29, wherein an inflection point, which is at a boundary between the first section and the second section, does not exist on the surface which is parallel to the proceeding direction of the laser beam.

32. The method of claim 29, wherein a cross-section of the laser beam which is irradiated onto the sealing unit is rectangular along the sealing line.

33. The method of claim 16, wherein the laser beam on a surface which is parallel to the proceeding direction of the laser beam has a different beam intensity increase rate from a beam intensity increase rate of a beam profile on the surface which is perpendicular to the proceeding direction of the laser beam, and has a beam profile which is symmetrical relative to a center of the laser beam overall.

34. The method of claim 33, wherein the beam profile on the surface which is parallel to the proceeding direction of the laser beam has a beam intensity which decreases from the center portion of the laser beam to an end portion of the laser beam.

35. The method of claim 33, wherein a beam profile on the surface which is parallel to the proceeding direction of the laser beam has a beam intensity which increases from the center portion of the laser beam to the end portion of the laser beam.

36. The method of claim 33, wherein the laser beam is irradiated onto the sealing unit in the form of a spot beam along the sealing line.

37. A method of manufacturing an organic light emitting display device, the method comprising the steps of:
forming an organic light emitting unit between a first substrate and a second substrate;
forming a sealing unit between the first and second substrates so as to surround the organic light emitting unit;
aligning the first substrate and the second substrate;
irradiating a laser beam onto the sealing unit, wherein a beam intensity increases from a center portion of the laser beam to an end portion of the laser beam on a surface which is perpendicular to a proceeding direction of the laser beam, and the beam intensity at the center portion of the laser beam is no greater than half of the beam intensity at the end portion of the laser beam, and the laser beam has a beam profile which is symmetrical relative to the proceeding direction of the laser beam; and
irradiating the laser beam along a sealing line of the sealing unit.

38. The method of claim 37, wherein the center portion of the laser beam is focused onto a center line of the sealing line, and the laser beam is then irradiated onto the center line of the sealing line by scanning along the center line of the sealing line.

39. The method of claim 37, wherein the organic light emitting unit includes at least one organic light emitting device in which at least one organic layer, including an emission layer, is interposed between a first electrode and a second electrode.

40. The method of claim 37, wherein the laser beam sequentially includes a first section in which a beam intensity slowly increases from the center portion of the laser beam to the end portion of the laser beam, and a second section having a greater beam intensity increase rate than the first section.

41. The method of claim 40, wherein the laser beam is symmetrical relative to a surface which is parallel to the proceeding direction of the laser beam.

42. The method of claim 40, wherein the laser beam has a uniform beam intensity on a surface which is parallel to the proceeding direction of the laser beam.

43. The method of claim 37, wherein the laser beam on a surface which is parallel to the proceeding direction of the laser beam has a different beam intensity increase rate compared to a beam intensity increase rate of a beam profile on the surface which is perpendicular to the proceeding direction of the laser beam, and has a beam profile which is symmetrical relative to a center of the laser beam overall.

44. The method of claim 37, wherein the sealing unit comprises a frit.

45. The method of claim 44, wherein the frit forms a closed loop so as to surround the organic light emitting unit.

46. The method of claim 45, wherein each edge of the closed loop is a curve having a predetermined curvature.

47. The method of claim 45, wherein each edge of the closed loop is right-angled.

* * * * *